United States Patent
Nishimura et al.

(10) Patent No.: US 7,071,255 B2
(45) Date of Patent: *Jul. 4, 2006

(54) RADIATION-SENSITIVE COMPOSITION CAPABLE OF HAVING REFRACTIVE INDEX DISTRIBUTION

(75) Inventors: Isao Nishimura, Tokyo (JP); Nobuo Bessho, Tokyo (JP); Atsushi Kumano, Tokyo (JP); Kenji Yamada, Kyoto (JP)

(73) Assignee: JSR Corporation, Tokyo (JP)

( * ) Notice: Subject to any disclaimer, the term of this patent is extended or adjusted under 35 U.S.C. 154(b) by 156 days.

This patent is subject to a terminal disclaimer.

(21) Appl. No.: 10/257,397

(22) PCT Filed: Feb. 18, 2002

(86) PCT No.: PCT/JP02/01362

§ 371 (c)(1),
(2), (4) Date: Oct. 18, 2002

(87) PCT Pub. No.: WO02/066561

PCT Pub. Date: Aug. 29, 2002

(65) Prior Publication Data

US 2003/0187119 A1 Oct. 2, 2003

(30) Foreign Application Priority Data

Feb. 19, 2001 (JP) .................................. 2001-041437

(51) Int. Cl.
*C08L 3/20* (2006.01)
*G03C 1/492* (2006.01)

(52) U.S. Cl. .................... 524/430; 428/913; 430/270.1; 430/285.1

(58) Field of Classification Search ................. 524/430, 524/492, 497, 437; 428/913; 430/270.1, 285.1
See application file for complete search history.

(56) References Cited

U.S. PATENT DOCUMENTS

| | | | |
|---|---|---|---|
| 3,940,507 A | 2/1976 | Fech, Jr. et al. | 427/43 |
| 4,247,611 A | 1/1981 | Sander et al. | 430/286 |
| 5,627,010 A | 5/1997 | Pai et al. | 430/270.1 |
| 5,958,648 A * | 9/1999 | Nishimura et al. | 430/270.1 |
| 6,399,267 B1 | 6/2002 | Nishimura et al. | 430/192 |
| 2003/0171468 A1 * | 9/2003 | Nishimura et al. | 524/261 |

FOREIGN PATENT DOCUMENTS

| | | |
|---|---|---|
| EP | 0 255 454 | 6/1987 |
| EP | 0 965 618 A1 * | 12/1999 |
| JP | 45-11712 | 4/1970 |
| JP | 55-9433 | 3/1980 |
| JP | 56-17345 | 2/1981 |
| JP | 57-31674 | 2/1982 |
| JP | 60-037549 | 2/1985 |
| JP | 62-025705 | 2/1987 |
| JP | 62-136638 | 6/1987 |
| JP | 62-190211 | 8/1987 |
| JP | 63-097945 | 4/1988 |
| JP | 64-003647 | 1/1989 |
| JP | 2-146544 | 6/1990 |
| JP | 3-192310 | 8/1991 |
| JP | 4-303843 | 10/1992 |
| JP | 4-330444 | 11/1992 |
| JP | 5-060931 | 3/1993 |
| JP | 7-056026 | 3/1995 |
| JP | 7-056354 | 3/1995 |
| JP | 7-092313 | 4/1995 |
| JP | 8-44052 | 2/1996 |
| JP | 8-336911 | 12/1996 |
| JP | 8-337609 | 12/1996 |
| JP | 9-133813 | 5/1997 |
| JP | 9-178901 | 7/1997 |
| JP | 2000-7383 | 1/2000 |
| JP | 2001-172512 | 6/2001 |
| JP | 2001-281429 | 10/2001 |
| WO | 93/19505 | 9/1993 |
| WO | 94/04949 | 3/1994 |

OTHER PUBLICATIONS

Tadatomi Nishikubo et al.: "New synthesis of poly(silyl ether) and poly(germyl ether) by addition reactions of bisepoxides with dimethyldiphenoxysilane and dimethyldiphenoxygermane" Macromolecules, vol. 29, pp. 5529–5534 1996.

N. Okui et al.: "Studies of the chemical degradation of polysiloxanes by hydrofluoric acid: 1. Poly(tetramethyl–p–silphenylene siloxane)" POLYMER, vol. 17, pp. 1086–1090 Dec. 1976.

Jean M.J. Frechet et al.: "Design and synthesis of novel allylic and benzylic copolycarbonates susceptible to acidolytic or thermolytic depolymerization" Makromol. Chem., vol. 7, pp. 121–126 1986.

E.N. Kumpanenko et al.: "Kinetics of thermal and acidic degradation of poly–1,3–dioxolane" Journal of Polymer Science: Part A–1, vol. 8, pp. 2375–2381 1970.

Ronald P. Simonds et al.: "Cationic degradation of poly(propylene sulfide)" Makromol. Chem., vol. 179, pp. 1689–1697 1978.

Wallace H. Carothers et al.: "Studies of polymerization and ring formation. XV. Artificial fibers from synthetic linear condensation superpolymers" J. Am. Chem. Soc., vol. 54, pp. 1579–1587 1932.

(Continued)

*Primary Examiner*—David W. Wu
*Assistant Examiner*—Rip A. Lee
(74) *Attorney, Agent, or Firm*—Oblon, Spivak, McClelland, Maier & Neustadt, P.C.

(57) ABSTRACT

A method of forming a refractive index pattern or an optical material stable regardless of use conditions, which provides a sufficiently large change in refractive index by a simple method. The refractive index pattern or optical material is formed by exposing a refractive index changing composition which comprises (A) a decomposable compound, (B) a non-decomposable compound containing inorganic oxide particles and (C) a radiation sensitive decomposer to radiation and then treating it with (D) a stabilizer.

20 Claims, No Drawings

OTHER PUBLICATIONS

Andre Conix: "Aromatic polyanhydrides, a new class of high melting fiber–forming polymers" Journal of Polymer Science, vol. 29, pp. 343–353 1958.

Abraham J. Domb: "Synthesis and characterization of biodegradable aromatic anhydride copolymers" MACROMOLECULES, vol. 25, pp. 12–17 1992.

K.W. Leong et al.: "Synthesis of polyanhydrides: melt–polycondensation, dehydrochlorination, and dehydrative coupling" MACROMOLECULES, vol. 20, No. 4, pp. 705–712 Apr. 1987.

Abraham J. Domb et al.: "Poly(anhydrides). 2. One–step polymerization using phosgene or diphosgene as coupling agents" MACROMOLECULES, vol. 21, pp. 1925–1929 1988.

Hans R. Kricheldorf et al.: "Synthesis of polyanhydrides from trimethylsilyl dicraboxylates and dicarbonyl chlorides" Makromol. Chem., vol. 11, pp. 83–88 1990.

Moriyuki Sato: "Preparation of a polysulfone by polycondensation of disodium 4,4'–oxydibenzensulfinate with bis-(chloromethyl) ketone" Makromol. Chem., vol. 5, pp. 151–155 1984.

Silvia Lazcano et al.: "Oxidation of poly(2,2–dimethyltrimethylene sulfide) in solution" Makromol. Chem., vol. 189, pp. 2229–2238 1988.

Eiichi Kobayashi et al.: "Addition polymerization of 1,4–diethynylbenzene with 1,4–benzenedithiol and properties of the resulting copolymer" Makromol. Chem., vol. 187, pp. 2525–2533, 1986.

Eiichi Kobayashi et al.: "Polyaddition of dithiol compounds to divinyl compounds: the kinetics of the model addition reaction of thiophenols to styrenes" Polymer Journal, vol. 22, No. 9, pp. 803–813, 1990.

Wawrzyniec Podkoscielny et al.: "Linear polythioesters. XIII. Products of polycondensation of isometric di(mercaptomethyl)–dimethylbenzenes with adipoyl and sebacoyl chlorides" Journal of Applied Polymer Science, vol. 35, pp. 85–101, 1988.

Wawrzyniec Podkoscielny et al.: "Linear polythioesters. VIII. Products of interfacial polycondensation of 1,4–di(mercaptomethyl)–tetramethylbenzene with isomeric phthaloyl chlorides" Journal of Polymer Science, vol. 22, pp. 1579–1586, 1984.

Wawrzyniec Podkoscielny et al.: "Linear polyioesters. I. Products of interfacial polycondensation of 4,4'–di(mercaptomethyl)benzephenone with terephthaloyl, isophthaloyl, and phthaloyl chlorides" Journal of Polymer Science, vol. 14, pp. 656–662, 1976.

Wawrzyniec Podkoscielny et al.: "Linear polythioesters. II. Products of interfacial polycondensation of 1,4–di(mercaptomethyl)–naphthalene, 1,5–di(mercaptomethyl) naphthalene, and a mixture of 1,4– and 1,5–di(mercaptomethyl) –naphthalene with terephthaloyl and isophthaloyl chlorides" Journal of Polymer Science, vol. 17, pp. 2429–2438, 1979.

A. Zochniak et al.: "Products of polyaddition of 1,5–pentanediol dithioglycotate with 2,4–tolyene diisocyanate and with 4,4–diphenylmethane diisocyanate" J. Macromol. Sci., vol. A9, No. 7, pp. 1265–1271, 1975.

Corrado Berti et al.: "Polymers with thiocarbonate and dithiocarbonate moieties from aliphatic dithiols. Syntheses and characterization" Makromol. Chem., vol. 189, pp. 1323–1330, 1988.

Roger Ketcham et al.: "Cis– and trans–stilbene sulfides" J. Org. Chem., vol. 23, pp. 229–230 Jan. 1963.

* cited by examiner

RADIATION-SENSITIVE COMPOSITION CAPABLE OF HAVING REFRACTIVE INDEX DISTRIBUTION

DETAILED DESCRIPTION OF THE INVENTION

1. Field of the Invention

The present invention relates to a radiation sensitive refractive index changing composition, refractive index changing method, refractive index pattern forming method, refractive index pattern and optical material. More specifically, it relates to a refractive index pattern forming method which gives a novel refractive index pattern and an optical material for use in optoelectronic and display fields, a refractive index changing method and a radiation sensitive refractive index changing composition suitably used in these methods.

2. Description of the Prior Art

In the current society called "multi-media society", refractive index distribution type optically molded products each consisting of different refractive index regions are in great demand. The products include not only optical fibers for transmitting information but also optical diffraction gratings having a periodical change in refractive index, optical memories in which information is written at sites having different refractive indices, optically coupled elements such as optical IC's having a fine refractive index pattern, optical control elements, optical modulation elements and optical transmission elements.

The refractive index distribution type optically molded products are divided into two types: one having a continuous refractive index distribution in a molded product, such as GI type optical fibers (to be referred to as "GRIN optically molded products" hereinafter) and the other having a discontinuous refractive index distribution, such as optical diffraction gratings and SI type optical waveguides.

The GRIN optically molded products are attracting much attention as the next-generation optically molded products. For example, a GI type optical fiber whose refractive index is reduced from the center axis of the core of the optical fiber to the periphery in a parabolic form can transmit a great volume of information. A GRIN lens whose refractive index continuously changes therein is used as a reading lens for use in copiers, spherical lens for connecting fibers, or micro-lens, making use of its characteristic features that it has refractive power even on a flat surface and that it is free from spherical aberration.

A large number of methods of producing the above GRIN optically molded products have been proposed up till now. For example, JP-A 9-133813, JP-A 8-336911, JP-A 8-337609, JP-A 3-192310, JP-A 5-60931 (the term "JP-A" as used herein means an "unexamined published Japanese patent application"), WO93/19505 and WO94/04949 disclose a method of obtaining a GI type optical fiber by dispersing a low molecule weight compound or a monomer into a polymer and continuously distributing its concentration. JP-A 62-25705 discloses that a rod-like GI type optically molded product or optical fiber is obtained by photocopolymerizing two or more vinyl monomers having different refractive indices and reactivity ratios. Further, JP-A 7-56026 discloses a method of obtaining a refractive index distribution by forming a polymer A having a photoreactive functional group, dispersing a compound B having a lower refractive index than the polymer A into the polymer A to form the concentration distribution of the compound B and photo-reacting the polymer A with the compound B.

Some methods of producing GRIN optically molded products of an inorganic material have also been proposed. One of them is, for example, a method of producing a GI type rod having high refractive index thallium to rod-like glass essentially composed of silicon or lead, immersing the glass in a molten solution containing low refractive index potassium, and forming a potassium concentration distribution by ion exchange.

A GRIN lens can be obtained likewise by applying the above method to a short rod, that is, lens-like optically molded product. Alternatively, the GI type rod produced by the above method may be sliced.

As one of the methods of producing an optically molded product having a fine refractive index pattern, such as the above optical diffraction grating or optical IC, there is known a technology for obtaining a change in refractive index by causing a photochemical reaction in a molded product through exposure to light. For instance, in the case of an inorganic material, glass doped with germanium is exposed to light to change its refractive index so as to produce an optical diffraction grating. In the case of an organic material, the above technology is known as a photochromic reaction or photobleaching. JP-A 7-92313 discloses a technology for obtaining an optical diffraction grating by causing a change in refractive index through the exposure of a material containing a low molecule weight compound having photochemical reactivity dispersed in a polymer to a laser beam. Further, JP-A 9-178901 has recently proposed the application of this technology to the production of a GRIN optically molded product. This method provides a continuous refractive index distribution in a depth direction with respect to irradiation, making use of the fact that light irradiated onto a molded product is absorbed and weakened in intensity.

However, in the refractive index distributions obtained with the above conventional materials, the maximum refractive index difference is only about 0.001 to 0.02 and it is difficult to provide a wider refractive index distribution for preventing an optical loss and suppressing the malfunction of a circuit.

When the above conventional materials are used under the condition that light having a wavelength close to the wavelength used for changing the refractive index passes therethrough after a refractive index distribution is formed, it is impossible to prevent a phenomenon that a gradual change in refractive index occurs, thereby deteriorating the materials.

Problem to Be Solved by the Invention

The present invention has been made in view of the above situation of the prior art.

That is, it is an object of the present invention to provide a refractive index pattern and an optical material whose refractive indices are changed by a simple method, whose changed refractive index differences are sufficiently large and which are stable regardless of use conditions after forming and a novel method of forming the same.

Other objects and advantages of the present invention will become apparent from the following description.

Means for Solving the Problem

According to the present invention, firstly, the above objects and advantages of the present invention are attained by a radiation sensitive refractive index changing composition which comprises (A) a decomposable compound, (B) an non-decomposable component containing inorganic oxide particles and (C) a radiation sensitive decomposer.

Secondly, the above objects and advantages of the present invention are attained by a method of changing refractive index, comprising exposing the above radiation sensitive refractive index changing composition of the present invention to radiation.

Thirdly, the above objects and advantages of the present invention are attained by a method of forming a refractive index pattern, comprising exposing part of the above radiation sensitive refractive index changing composition to radiation.

In the fourth place, the above objects and advantages of the present invention are attained by a refractive index pattern formed by the above method of forming a refractive index pattern.

In the fifth place, the above objects and advantages of the present invention are attained by an optical material formed by the above method of forming a refractive index pattern.

In the present invention, the "refractive index patterns" means a refractive index distribution type material consisting of regions which differ from one another in refractive index.

Each of the components of the refractive index changing composition used in the present invention will be described in detail hereinunder.

(A) Decomposable Compound

The decomposable compound (A) used in the present invention can be an acid decomposable compound or a base decomposable compound and its refractive index is preferably 1.7 or less. The weight average molecular weight of the decomposable compound (A) is preferably 100 to 500,000, more preferably 100 to 300,000.

The acid decomposable compound is selected from compounds having at least one structure selected from the group consisting of structures represented by the following formulas (1) to (6) and (10). These compounds may be used alone or in combination of two or more.

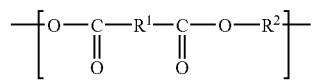
(1)

(In the formula (1), $R^1$ is an alkylene group, perfluoroalkylene group, alkylsilylene group, alkylene-arylene-alkylene group or arylene group, and $R^2$ is an alkylene group, perfluoroalkylene group, alkylene-arylene-alkylene group, arylene group, alkylsilylene group or alkylgermylene group, with the proviso that the above alkylene group or perfluoroalkylene group may contain a —O—, —CO—, —COO— or —OCOO— bond.)

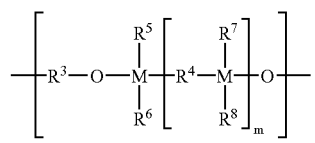
(2)

(In the formula (2), M is Si or Ge, $R^3$ is an alkylene group, perfluoroalkylene group, alkylene-arylene-alkylene group, arylene group, alkylsilylene group, alkylgermylene group or single bond, $R^4$ is an oxygen atom, alkylene group, perfluoroalkylene group, alkylene-arylene-alkylene group, arylene group, alkylsilylene group or single bond, $R^5$, $R^6$, $R^7$ and $R^8$ are each independently a hydrogen atom, alkyl group, aryl group, alkoxyl group, thioalkyl group, alkoxyester group, perfluoroalkyl group, perfluoroalkoxyl group, perfluoroalkoxyester group or perfluoroaryl group, and m is an integer of 0 to 2, with the proviso that the above alkylene group or perfluoroalkylene group may contain a —O—, —CO—, —COO— or —OCOO— bond.)

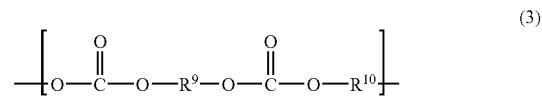
(3)

(In the formula (3), $R^9$ and $R^{10}$ are each independently an alkylene group, perfluoroalkylene group, alkylene-arylene-alkylene group, arylene group, alkylsilylene group or alkylgermylene group, with the proviso that the above alkylene group or perfluoroalkylene group may contain a —O—, —CO—, —COO— or —OCOO— bond.)

(4)

(In the formula (4), $R^{11}$ is an oxyalkylene group or single bond, and $R^{12}$ is a hydrogen atom, alkyl group, alkoxyl group, alkoxyester group, perfluoroalkyl group, perfluoroalkoxyester group, perfluoroaryl group, alkylene-arylene-alkylene group or aryl group.)

(5)

(In the formula (5), $R^{13}$ is a hydrogen atom, alkyl group, alkoxyl group, alkoxyester group, perfluoroalkyl group, perfluoroalkoxyl group, perfluoroalkoxyester group, perfluoroaryl group or aryl group.)

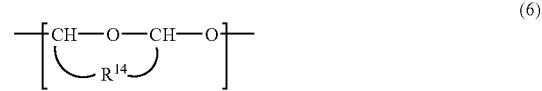
(6)

(In the formula (6), $R^{14}$ is an alkylene group or a structure represented by the following formula (7), (8) or (9).)

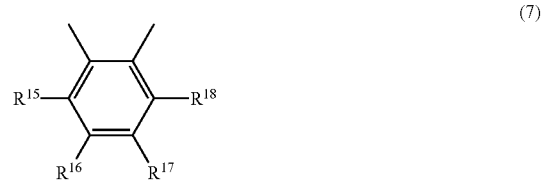
(7)

(In the formula (7), $R^{15}$, $R^{16}$, $R^{17}$ and $R^{18}$ are each independently a hydrogen atom, chain alkyl group having 1 to 6 carbon atoms, chlorine atom, bromine atom, iodine atom, hydroxyl group, mercapto group, carboxyl group, alkoxyl group having 1 to 6 carbon atoms, alkylthio group having 1 to 6 carbon atoms, haloalkyl group having 1 to 6 carbon atoms, haloalkoxyl group having 1 to 6 carbon atoms, haloalkylthio group having 1 to 6 carbon atoms, hydroxyalkyl group having 1 to 6 carbon atoms, mercaptoalkyl group having 1 to 6 carbon atoms, hydroxyalkoxyl group having 1 to 6 carbon atoms, mercaptoalkylthio group having 1 to 6 carbon atoms, aryl group having 6 to 10 carbon atoms or aralkyl group having 7 to 11 carbon atoms.)

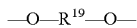 (8)

(In the formula (8), $R^{19}$ is an alkylene group.)

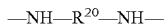 (9)

(In the formula (9), $R^{20}$ is an alkylene group.)

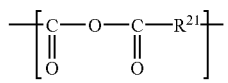 (10)

(In the formula (10), $R^{21}$ is an alkylene group, alkylene-arylene-alkylene group or arylene group.)

The base decomposable compound is selected from compounds having at least one structure selected from the group consisting of structures represented by the following formulas (11) to (14). These compounds may be used alone or in combination of two or more.

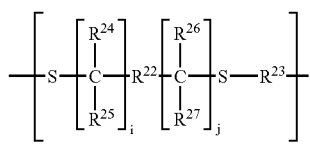 (11)

(In the formula (11), $R^{22}$ is an alkylene group, aralkylene group or arylene group, $R^{23}$ is an alkylene group, aralkylene group, arylene group, alkylene-arylene-alkylene group, alkylsilylene group or alkylgermylene group, $R^{24}$, $R^{25}$, $R^{26}$ and $R^{27}$ are each independently a hydrogen atom, alkyl group, aryl group, alkoxyl group or thioalkyl group, and i and j are each independently 0 or 1.)

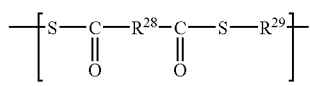 (12)

(In the formula (12), $R^{28}$ is an alkylene group, aralkylene group or arylene group, and $R^{29}$ is an alkylene group, aralkylene group, arylene group, alkylene-arylene-alkylene group, alkylsilylene group or alkylgermylene group.)

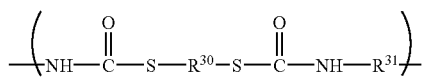 (13)

(In the formula (13), $R^{30}$ and $R^{31}$ are each independently an alkylene group, aralkylene group, arylene group, alkylene-arylene-alkylene group, alkylsilylene group or alkylgermylene group.)

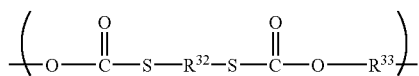 (14)

(In the formula (14), $R^{32}$ and $R^{33}$ are each independently an alkylene group, aralkylene group, arylene group, alkylene-arylene-alkylene group, alkylsilylene group or alkylgermylene group.)

All the above alkylene-arylene-alkylene groups each independently have a structure represented by the following formula (15) or (16):

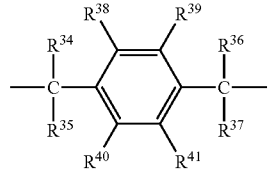 (15)

(In the formula (15), $R^{34}$, $R^{35}$, $R^{36}$ and $R^{37}$ are each independently a hydrogen atom, chain alkyl group having 1 to 6 carbon atoms or aryl group having 6 to 10 carbon atoms, and $R^{38}$, $R^{39}$, $R^{40}$ and $R^{41}$ are each independently a hydrogen atom, chlorine atom, bromine atom, hydroxyl group, mercapto group, alkoxyl group, thioalkyl group, alkylester group, alkylthioester group, aryl group, cyano group or nitro group.)

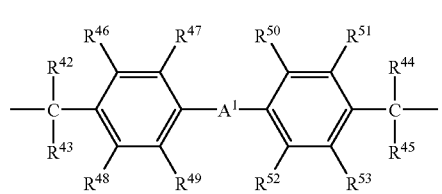 (16)

(In the formula (16), $R^{42}$, $R^{43}$, $R^{44}$ and $R^{45}$ are each independently a hydrogen atom, chain alkyl group having 1 to 6 carbon atoms or aryl group having 6 to 10 carbon atoms, $R^{46}$, $R^{47}$, $R^{48}$, $R^{49}$, $R^{50}$, $R^{51}$, $R^{52}$ and $R^{53}$ are each independently a hydrogen atom, chlorine atom, bromine atom, hydroxyl group, mercapto group, alkoxyl group, thioalkyl group, alkylester group, alkylthioester group, aryl group, cyano group or nitro group, and $A^1$ is —S—, —O—, —SO$_2$—, —CO—, —COO—, —OCOO—, —CH$_2$— or —C(R$^{54}$)$_2$— (R$^{54}$ is a chain alkyl group having 1 to 6 carbon atoms)).

All the above arylene groups each independently have a structure represented by the following formula (17):

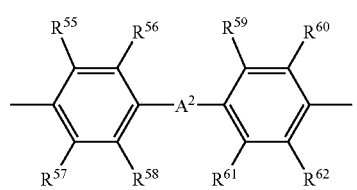 (17)

wherein $R^{55}$ to $R^{62}$ are each independently a hydrogen atom, chlorine atom, bromine atom, hydroxyl group, mercapto group, alkoxyl group, thioalkyl group, alkylester group, alkylthioester group, aryl group, cyano group or nitro group, and $A^2$ is —S—, —O—, —SO$_2$—, —CO—, —COO—, —OCOO—, —CH$_2$— or —C(R$^{63}$)$_2$— (R$^{63}$ is a chain alkyl group having 1 to 6 carbon atoms).

All the above alkylsilylene groups each independently have a structure represented by the following formula (18):

(18)

wherein $R^{64}$, $R^{65}$, $R^{66}$ and $R^{67}$ are each independently a hydrogen atom, chain alkyl group having 1 to 6 carbon atoms or aryl group having 6 to 10 carbon atoms, $A^3$ is —O—, alkylene group or arylene group, and a is an integer of 0 or 1.

All the above alkylgermylene groups each independently have a structure represented by the following formula (19):

(19)

wherein $R^{68}$, $R^{69}$, $R^{70}$ and $R^{71}$ are each independently a hydrogen atom, chain alkyl group having 1 to 6 carbon atoms or aryl group having 6 to 10 carbon atoms, $A^4$ is —O—, alkylene group or arylene group, and b is an integer of 0 or 1.

All the above alkylene groups can be a linear, branched or cyclic alkylene group having 1 to 10 carbon atoms, some of the hydrogen atoms contained in the above groups may be substituted by a fluorine atom, or some or all of the hydrogen atoms contained in the above groups may be substituted by a chlorine atom, bromine atom, perfluoroalkyl group, hydroxyl group, mercapto group, thioalkyl group, alkoxyl group, perfluoroalkoxyl group, alkylester group, alkylthioester group, perfluoroalkylester group, cyano group or nitro group.

The alkyl group contained in all the above alkyl groups, alkoxyl groups, thioalkyl groups, alkylester groups and alkylthioester groups can be a linear, branched or cyclic alkyl group having 1 to 10 carbon atoms, some of the hydrogen atoms contained in the above groups may be substituted by a fluorine atom, or some or all of the hydrogen atoms contained in the above groups may be substituted by a chlorine atom, bromine atom, perfluoroalkyl group, hydroxyl group, mercapto group, thioalkyl group, alkoxyl group, perfluoroalkoxyl group, alkylester group, alkylthioester group, perfluoroalkylester group, cyano group, nitro group or aryl group.

All the above perfluoroaryl groups are each independently a perfluorophenyl group, perfluoronaphthyl group, perfluoroanthracenyl group or perfluorobiphenyl group, and a fluorine atom contained in the above groups may be substituted by a hydroxyl group, perfluoroalkoxyl group, perfluoroalkyl group, perfluoroalkylester group, cyano group or nitro group.

All the above aryl groups are each independently a phenyl group, naphthyl group, anthracenyl group or biphenyl group, and a hydrogen atom contained in the above groups may be substituted by a chlorine atom, bromine atom, hydroxyl group, mercapto group, alkoxyl group, thioalkyl group, alkylester group, alkylthioester group, cyano group or nitro group.

Methods of producing acid or base decomposable compounds having structures represented by the above formulas (1) to (6) and (10) in the present invention as a recurring unit, for example, are already known.

Methods of producing a compound having a structure represented by the above formula (1) are disclosed by Polymer Bull., 1. 199 (1978), JP-A 62-136638, EP 225,454, U.S. Pat. No. 806,597, JP-A 4-303843, JP-A 7-56354 and the like.

Methods of producing a compound having a structure represented by the above formula (2) are disclosed by Macromolecules 29, 5529 (1996), Polymer 17, 1086 (1976), JP-A 60-37549 and the like.

Methods of producing a compound having a structure represented by the above formula (3) are disclosed by Electrochem. Soc., Solid State Sci. Technol., 133(1) 181 (1986), J. Imaging Sci., 30(2)59 (1986), Macromol. Chem., Rapid Commun., 7, 121(1986) and the like.

Methods of producing a compound having a structure represented by the above formula (4) are disclosed by U.S. Pat. No. 3,894,253, JP-A 62-190211, JP-A 2-146544, Macromol. Chem., 23, 16 (1957), JP-A 63-97945, Polymer Sci., A-1, 8, 2375 (1970), U.S. Pat. No. 4,247,611, EP 41,657, JP-A 57-31674, JP-A 64-3647, JP-A 56-17345 and the like.

Methods of producing a compound having a structure represented by the above formula (5) are disclosed by Prepr. Eur. Disc Meet. Polymer Sci., Strasbourg, p. 106 (1978), Macromol. Chem., 179, 1689 (1978) and the like.

Methods of producing a compound having a structure represented by the above formula (6) are disclosed by U.S. Pat. No. 3,894,253, U.S. Pat. No. 3,940,507, JP-A 62-190211 and the like.

Methods of producing a compound having a structure represented by the above formula (10) are disclosed by J. Am. Chem. Soc., 54, 1579 (1932), J. Polym, Sci., 29, 343 (1958), J. Polym. Sci., Part A, Polym. Chem., 25, 3373 (1958), Macromolecules, 25, 12, (1992), Macromolecules, 20, 705, (1987), Macromolecules 21, 1925, (1988), Macromol. Chem., Rapid, Commun., 11, 83 (1990) and the like.

Methods of producing base decomposable compounds having structures represented by the above formulas (11) to (14) as a recurring unit, for example, are also known.

Methods of producing a compound having a structure represented by the above formula (11) are disclosed by Macromol. Chem., Rapid Commun., 5, 151 (1984), Macromol. Chem., 189, 2229 (1988), Macromol. Chem., 187, 2525 (1986), Polym. J., 22, 803 (1990) and the like.

Methods of producing a compound having a structure represented by the above formula (12) are disclosed by J. Polym. Sci., 47, 1523 (1993), J. Appln. Polym. Sci., 35, 85 (1988), J. Polym, Sci., Polym. Chem. Ed., 22, 1579, (1984), J. Polym. Sci., Polym. Chem. Ed., 14, 655 (1976), J. Polym. Sci., Polym. Chem. Ed., 17, 2429 (1979) and the like.

Methods of producing a compound having a structure represented by the above formula (13) are disclosed by J. Macromol. Sci. Chem., A9, 1265 (1975) and the like.

Methods of producing a compound having a structure represented by the above formula (14) are disclosed by Polym. Bull., 14, 85 (1985), Macromol. Chem., 189, 1323 (1988) and the like.

The weight average molecular weight of the decomposable compound (A) is preferably 100 to 500,000, more preferably 100 to 300,000.

When the above decomposable compounds (A) are classified according to refractive index for the convenience, a compound having at least one of the following structures (i) to (vii) is preferred as a compound having a refractive index of 1.5 or less.

(i) The structure of the formula (1) in which $R^1$ and $R^2$ are each independently an alkylene group, perfluoroalkylene group or alkylsilylene group, with the proviso that the above alkylene group or perfluoroalkylene group may contain a —O—, —CO—, —COO— or —OCOO— bond.

(ii) The structure of the formula (2) in which M is Si or Ge, $R^3$ is an alkylene group or perfluoroalkylene group, $R^4$ is an alkylene group, perfluoroalkylene group, alkylsilylene group or single bond, $R^5$, $R^6$, $R^7$ and $R^8$ are each independently a hydrogen atom, alkyl group, alkoxyl group, alkoxyester group, perfluoroalkyl group, perfluoroalkoxyl group, perfluoroalkoxyester group or perfluoroaryl group, and m is an integer of 0 to 2, with the proviso that the above alkylene group or perfluoroalkylene group may contain a —O—, —CO—, —COO— or —OCOO— bond.

(iii) The structure of the formula (3) in which $R^9$ and $R^{10}$ are each independently an alkylene group or perfluoroalkylene group, with the proviso that the above alkylene group or perfluoroalkylene group may contain a —O—, —CO—, —COO— or —OCOO— bond.

(iv) The structure of the formula (4) in which $R^{11}$ is an oxyalkylene group or single bond, and $R^{12}$ is a hydrogen atom, alkyl group, alkoxyl group, alkoxyester group, perfluoroalkyl group, perfluoroalkoxyester group or perfluoroaryl group.

(v) The structure of the formula (5) in which $R^{13}$ is a hydrogen atom, alkyl group, alkoxyl group, alkoxyester group, perfluoroalkyl group, perfluoroalkoxyl group, perfluoroalkoxyester group or perfluoroaryl group.

(vi) The structure represented by the formula (6).

(vii) The structure of the formula (10) in which $R^{21}$ is an alkylene group.

A compound having at least one of the following structures (viii) to (xiv) is preferred as a compound having a refractive index of more than 1.5.

(viii) The structure of the formula (1) in which $R^1$ is an alkylene group, alkylene-arylene-alkylene group or arylene group, and $R^2$ is an alkylene group, alkylene-arylene-alkylene group, arylene group, alkylsilylene group or alkylgermylene group.

(ix) The structure of the formula (2) in which M is Si or Ge, $R^3$ is an alkylene group, alkylene-arylene-alkylene group, arylene group, alkylsilylene group or alkylgermylene group, $R^4$ is an oxygen atom, alkylene group, alkylene-arylene-alkylene group, arylene group or single bond, $R^5$, $R^6$, $R^7$ and $R^8$ are each independently a hydrogen atom, alkyl group, aryl group, alkoxyl group or thioalkyl group, and m is an integer of 0 to 2.

(x) The structure of the formula (3) in which $R^9$ and $R^{10}$ are each independently an alkylene group, alkylene-arylene-alkylene group, arylene group, alkylsilylene group or alkylgermylene group.

(xi) The structure of the formula (4) in which $R^{11}$ is an oxyalkylene group or single bond, and $R^{12}$ is a hydrogen atom, alkyl group, alkylene-arylene-alkylene group or aryl group.

(xii) The structure of the formula (5) in which $R^{13}$ is a hydrogen atom, alkyl group or aryl group.

(xiii) The structure represented by the formula (10)

(xiv)) The structures represented by the formulas (11) to (14).

(B) Non-decomposable Component Having Inorganic Oxide Particles

The non-decomposable component (B) is the above oxide particles or a combination of the oxide particles and a binder component. General inorganic oxide particles may be used as the oxide particles. Preferably, the non-decomposable component is stable to an acid or base formed from the radiation sensitive decomposer (C) to be described hereinafter, does not absorb light having a wavelength range used when it passes therethrough and has optically high transparency. Oxide particles having a preferred refractive index value is selected according to application purpose.

Preferred examples of the oxide particles include oxides containing an atom such as Be, Mg, Ca, Sr, Ba, Sc, Y, La, Ce, Gd, Tb, Dy, Yb, Lu, Ti, Zr, Hf, Nb, Mo, W, Zn, B, Al, Si, Ge, Sn, Pb, Bi or Te. More preferred examples of the oxide particles include oxides such as BeO, MgO, CaO, SrO, BaO, $Sc_2O_3$, $Y_2O_3$, $La_2O_3$, $Ce_2O_3$, $Gd_2O_3$, $Tb_2O_3$, $Dy_2O_3$, $Yb_2O_3$, $Lu_2O_3$, $TiO_2$, $ZrO_2$, $HfO_2$, $Nb_2O_5$, $MoO_3$, $WO_3$, ZnO, $B_2O_3$, $Al_2O_3$, $SiO_2$, $GeO_2$, $SnO_2$, PbO, $Bi_2O_3$ and $TeO_2$, and composite oxides containing these such as $Al_2O_3$—MgO, $Al_2O_3$—$SiO_2$, ZnO—$Y_2O_3$, $ZrO_2$—$Ce_2O_3$, $ZrO_2$—$TiO_2$—$SnO_2$, $TeO_2$—BaO—ZnO, $TeO_2$—$WO_3$—$Ta_2O_5$, $TeO_2$—$WO_3$—$Bi_2O_3$, $TeO_2$—BaO—PbO, CaO—$Al_2O_3$, CaO—$Al_2O_3$—BaO, CaO—$Al_2O_3$—$Na_2O$, CaO—$Al_2O_3$—$K_2O$ CaO—$Al_2O_3$—$SiO_2$, PbO—$Bi_2O_3$—BaO, PbO—$Bi_2O_3$—ZnO, PbO—$Bi_2O_3$, PbO—$Bi_2O_3$—BaO—ZnO, PbO—$Bi_2O_3$—CdO—$Al_2O_3$, PbO—$Bi_2O_3$—$GeO_2$, PbO—$Bi_2O_3$—$GeO_2$—$Tl_2O$, BaO—PbO—$Bi_2O_3$, BaO—PbO—$Bi_2O_3$—ZnO, $Bi_2O_3$—$Ga_2O_3$—PbO, $Bi_2O_3$—$Ga_2O_3$—CdO and $Bi_2O_3$—$Ga_2O_3$—(Pb, Cd)O.

The particle diameters of the oxide particles are preferably smaller than the wavelength of light used by the refractive index changing composition of the present invention and can be, for example, 2 μm or less, preferably 0.2 μm or less, particularly preferably 0.1 μm or less. When the particle diameters are larger than 2 μm, the transparency of the obtained refractive index changing composition may lower or a film obtained therefrom may have a problem with its surface state.

The shapes of the oxide particles are not particularly limited but preferably substantially spherical because the scattering of input light is small.

The above oxide particles may be contacted to a silane coupling agent, surfactant or coordination compound having coordination capability to a metal atom constituting the oxide to modify their surfaces before use.

The binder component is a non-decomposable compound which is stable to an acid or base and preferably has high optical transparency.

The non-decomposable compound is an acrylic resin, urethane-based resin, polyester-based resin, polycarbonate-based resin, norbornene-based resin, styrene-based resin, polyether sulfone-based resin, silicon resin, polyamide resin, polyimide resin, polysiloxane-based resin, fluorine-based resin, polybutadiene-based resin, vinylether-based resin, vinylester-based resin or the like. Any preferred non-decomposable compound can be selected depending on the refractive index of the decomposable compound (A) used. To increase its difference from the refractive index of the decomposable compound (A), a non-decomposable compound having an aromatic group, halogen atom or sulfur atom may be advantageously used.

Specific examples of the non-decomposable compound include the following compounds (the figures within parentheses are refractive index values measured by d-ray): polyvinylidene fluoride (1.42), polydimethylsiloxane (1.43), polytrifluoroethyl methacrylate (1.44), polyoxypropylene (1.45), polyvinylisobutyl ether (1.45), polyvinylethyl ether (1.45), polyoxyethylene (1.46), polyvinylbutyl ether (1.46), polyvinylpentyl ether (1.46), polyvinylhexyl ether (1.46), poly(4-methyl-1-pentene) (1.46 to 1.47), cellulose acetate butyrate (1.46 to 1.49), poly(4-fluoro-2-trifluoromethylstyrene) (1.46), polyvinyloctyl ether (1.46), poly(vinyl 2-ethylhexyl ether) (1.46), polyvinyldecyl ether (1.46), poly(2-methoxyethyl acrylate) (1.46), polybutyl acrylate (1.46), polybutyl acrylate (1.47), poly(t-butyl methacrylate) (1.46), polyvinyldodecyl ether (1.46), poly(3-ethoxypropyl acrylate) (1.47), polyoxycarbonyl tetramethylene (1.47), polyvinyl propionate (1.47), polyvinyl acetate (1.47), polyvinylmethyl ether (1.47), polyethyl acrylate (1.47), ethylene-vinyl acetate copolymer (1.47 to 1.50), (80% to 20% of vinylacetate)cellulose propionate (1.47 to 1.49), cellulose acetate propionate (1.47), benzyl cellulose (1.47 to 1.58), phenol-formaldehyde resin (1.47 to 1.70), cellulose triacetate (1.47 to 1.48), polyvinylmethyl ether (isotactic) (1.47), poly(3-methoxypropyl acrylate) (1.47), poly(2-ethoxyethyl acrylate) (1.47), polymethyl acrylate (1.47 to 1.48), polyisopropyl methacrylate (1.47), poly(1-decene) (1.47), polypropylene (atactic, density of 0.8575 g/cm$^3$) (1.47), poly(vinyl sec-butyl ether) (isotactic) (1.47), polydodecyl methacrylate (1.47), polyoxyethylene oxysuccinoyl (1.47), (polyethylene succinate) polytetradecyl methacrylate (1.47), ethylene-propylene copolymer (EPR-rubber) (1.47 to 1.48), polyhexadecyl methacrylate (1.48), polyvinyl formate (1.48), poly(2-fluoroethyl methacrylate) (1.48), polyisobutyl methacrylate (1.48), ethyl cellulose (1.48), polyvinyl acetal (1.48 to 1.50), cellulose acetate (1.48 to 1.50), cellulose tripropionate (1.48 to 1.49), polyoxymethylene (1.48), polyvinyl butyral (1.48 to 1.49), poly(n-hexyl methacrylate) (1.48), poly(n-butyl methacrylate) (1.48), polyethylidene dimethacrylate (1.48), poly(2-ethoxyethyl methacrylate) (1.48), polyoxyethylene oxymaleoyl (1.48), (polyethylene maleate) poly(n-propyl methacrylate) (1.48), poly(3,3,5-trimethylcyclohexyl methacrylate) (1.49), polyethyl methacrylate (1.49), poly(2-nitro-2-methylpropyl methacrylate) (1.49), polytriethylcarbinyl methacrylate (1.49), poly(1,1-diethylpropyl methacrylate) (1.49), polymethyl methacrylate (1.49), poly(2-decyl-1,3-butadiene) (1.49), polyvinyl alcohol (1.49 to 1.53), polyethyl glycolate methacrylate (1.49), poly(3-methylcyclohexyl methacrylate) (1.49), poly(cyclohexyl α-ethoxyacrylate) (1.50), methyl cellulose (low viscosity) (1.50), poly(4-methylcyclohexyl methacrylate) (1.50), polydecamethylene glycol dimethacrylate (1.50), polyurethane (1.50 to 1.60), poly(1,2-butadiene) (1.50), polyvinyl formal (1.50), poly(2-bromo-4-trifluoromethylstyrene) (1.50), cellulose nitrate (1.50 to 1.51), poly(sec-butyl α-chloroacrylate) (1.50), poly(2-heptyl-1,3-butadiene) (1.50), poly(ethyl α-chloroacrylate) (1.50), poly(2-isopropyl-1,3-butadiene) (1.50), poly(2-methylcyclohexyl methacrylate) (1.50), polypropylene (density of 0.9075 g/cm$^3$) (1.50), polyisobutene (1.51), polybornyl methacrylate (1.51), poly(2-t-butyl-1,3-butadiene) (1.51), polyethylene glycol dimethacrylate (1.51), polycyclohexyl methacrylate (1.51), poly(cyclohexanediol-1,4-dimethacrylate) (1.51), butyl rubber (unvulcanized) (1.51), polytetrahydrofurfuryl methacrylate (1.51), guttapercha (β) (1.51), polyethylene ionomer (1.51), polyoxyethylene (high molecular weight) (1.51 to 1.54), polyethylene (density of 0.914 g/cm$^3$) (1.51), (density of 0.94 to 0.945 g/cm$^3$) (1.52 to 1.53), (density of 0.965 g/cm$^3$) (1.55), poly(1-methylcyclohexyl methacrylate) (1.51), poly(2-hydroxyethylmethacrylate) (1.51), polyvinyl chloroacetate (1.51), polybutene (isotactic) (1.51), polyvinyl methacrylate (1.51), poly(N-butyl-methacrylamide) (1.51), guttapercha (α) (1.51), terpene resin (1.52), poly(1,3-butadiene) (1.52), shellac (1.51 to 1.53), poly(methyl α-chloroacrylate) (1.52), poly(2-chloroethyl methacrylate) (1.52), poly(2-diethylaminoethyl methacrylate) (1.52), poly(2-chlorocyclohexyl methacrylate) (1.52), poly(1,3-butadiene) (35% of cis-form; 56% of trans-form 1.5180; 7% of 1,2-addition), natural rubber (1.52), polyallyl methacrylate (1.52), polyvinyl chloride+40% of dioctyl phthalate (1.52), polyacrylonitrile (1.52), polymethacrylonitrile (1.52), poly(1,3-butadiene) (rich with cis type) (1.52), butadiene-acrylonitrile copolymer (1.52), polymethyl isopropenyl ketone (1.52), polyisoprene (1.52), polyester resin rigid (about 50% of styrene) (1.52 to 1.54), poly(N-(2-methoxyethyl)methacrylamide) (1.52), poly(2,3-dimethylbutadiene) (methyl rubber) (1.53), vinyl chloride-vinyl acetate copolymer (95/5 to 90/10) (1.53 to 1.54), polyacrylic acid (1.53), poly(1,3-dichloropropyl methacrylate) (1.53), poly(2-chloro-1-(chloromethyl)ethyl methacrylate) (1.53), polyacrolein (1.53), poly(1-vinyl-2-pyrrolidone) (1.53), hydrochlorinated rubber (1.53 to 1.55), nylon 6; nylon 6,6; nylon 6,10 (molded product) (1.53), butadiene-styrene copolymer (about 30% of styrene) (1.53), poly(cyclohexyl-α-chloroacrylate) block copolymer (1.53), poly(2-chloroethyl-α-chloroacrylate) (1.53), butadiene-styrene copolymer (about 75/25) (1.54), poly(2-aminoethyl methacrylate) (1.54), polyfurfuryl methacrylate (1.54), polybutylmercaptyl methacrylate (1.54), poly(1-phenyl-n-amyl methacrylate) (1.54), poly(N-methyl-methacrylamide) (1.54), cellulose (1.54), polyvinyl chloride (1.54 to 1.55), urea formaldehyde resin (1.54 to 1.56), poly(sec-butyl α-bromoacrylate) (1.54), poly(cyclohexyl α-bromoacrylate) (1.54), poly(2-bromoethyl methacrylate) (1.54), polydihydroabietic acid (1.54), polyabietic acid (1.546), polyethylmercaptyl methacrylate (1.55), poly(N-allylmethacrylamide) (1.55), poly(1-phenylethyl methacrylate) (1.55), polyvinylfuran (1.55), poly(2-vinyltetrahydrofuran) (1.55), poly(vinylchloride)+40% of tricresyl phosphate (1.55), poly(p-methoxybenzyl methacrylate) (1.55), polyisopropyl methacrylate) (1.55), poly(p-isopropylstyrene) (1.55), polychloroprene (1.55 to 1.56), poly(oxyethylene-α-benzoate-ω-methacrylate) (1.56), poly(p,p'-xylylenyl dimethacrylate) (1.56), poly(1-phenylallyl methacrylate) (1.56), poly(p-cyclohexylphenyl methacrylate) (1.56), poly(2-phenylethyl methacrylate) (1.56), poly(oxycarbonyloxy-1,4-phenylene-1-propyl) (1.56), poly(1-(o-chlorophenyl)ethyl methacrylate) (1.56), styrene-maleic anhydride copolymer (1.56), poly(1-phenylcyclohexyl methacrylate) (1.56), poly(oxycarbonyloxy-1,4-phenylene-1,3-dimethyl-butylidene-1,4-phenylene) (1.57), poly(methyl α-bromoacrylate) (1.57), polybenzyl methacrylate (1.57), poly(2-(phenylsulfonyl) ethyl methacrylate) (1.57), poly(m-cresyl methacrylate) (1.57), styrene-acrylonitrile copolymer (about 75/25) (1.57), poly(oxycarbonyloxy-1,4-phenylene isobutylidene-1,4-phenylene) (1.57), poly(o-methoxyphenyl methacrylate) (1.57), polyphenyl methacrylate (1.57), poly(o-cresyl methacrylate) (1.57), polydiallyl phthalate (1.57), poly(2,3-dibromopropyl methacrylate) (1.57), poly(oxycarbonyloxy-1,4-phenylene-1-methyl-butylidene-1,4-phenylene) (1.57), poly(oxy-2,6-dimethylphenylene) (1.58), polyoxyethylene oxyterephthaloyl (amorphous) (1.58), polyethylene terephthalate (1.51 to 1.64), polyvinyl benzoate (1.58), poly(oxycarbonyloxy-1,4-phenylenebutylidene-1,4-phenylene) (1.58), poly(1,2-diphenylethyl methacrylate) (1.58), poly(o-chlorobenzyl methacrylate) (1.58), poly(oxycarbonyloxy-1,4-phenylene-sec-butylidene-1,4-phenylene) (1.58), polyoxypentaerythritoloxyphthaloyl (1.58), poly(m-nitrobenzyl methacrylate) (1.58), poly(oxycarbonyloxy-1,4-phenyleneisopropylidene-1,4-phenylene) (1.59), poly(N-(2-phenylethyl)methacrylamide) (1.59), poly(4-methoxy-2-methylstyrene) (1.59), poly(o-methylstyrene) (1.59), polystyrene (1.59), poly(oxycarbonyloxy-1,4-phenylenecyclohexylidene-1,4-phenylene) (1.59), poly(o- methoxystyrene) (1.59), polydiphenylmethyl methacrylate (1.59), poly(oxycarbonyloxy-1,4-phenyleneethylidene-1,4-phenylene) (1.59), poly(p-bromophenylmethacrylate) (1.60), poly(N-benzylmethacrylamide) (1.60), poly(p-methoxystyrene) (1.60), polyvinylidene chloride (1.60 to 1.63), polysulfide ("Thiokol") (1.6 to 1.7), poly(o-chlorodiphenylmethyl methacrylate) (1.60), poly(oxycarbonyloxy-1,4-(2,6-dichloro)phenyleneisopropylidene-1,4-(2,6-dichloro)phenylene) (1.61), poly(oxycarbonyloxybis(1,4-(3,5-dichlorophenylene))) polypentachlorophenyl methacrylate (1.61), poly(o-chlorostyrene) (1.61), poly(phenyl α-bromoacrylate) (1.61), poly(p-divinylbenzene) (1.62), poly(N-vinylphthalimide) (1.62), poly(2,6-dichlorostyrene) (1.62), poly(β-naphthyl methacrylate) (1.63), poly(α-naphthylcarbinyl methacrylate) (1.63), polysulfone (1.63), poly(2-vinylthiophene) (1.64), poly(α-naphthyl methacrylate) (1.64), poly(oxycarbonyloxy-1,4-phenylenediphenyl-methylene-1,4-phenylene) (1.65), poly-vinylphenyl sulfide (1.66), butylphenol formaldehyde resin (1.66), urea-thiourea-formaldehyde resin (1.66), polyvinyl naphthalene (1.68), polyvinyl carbazole (1.68), naphthalene-formaldehyde resin (1.70), phenol-formaldehyde resin (1.70) and polypentabromophenyl methacrylate (1.71).

The non-decomposable compound may be a copolymer of two or more monomers constituting the above compounds.

The weight average molecular weight of the non-decomposable compound is preferably 100 to 500,000, more preferably 100 to 200,000.

The above non-decomposable compounds may be used alone or in combination of two or more.

The non-decomposable compound is used in an amount of preferably 300 parts or less by weight, more preferably 150 parts or less by weight based on 100 parts by weight of the inorganic oxide particles.

Particularly preferably, the refractive index $n_B$ of the component (B) and the refractive index $n_A$ of the component of decomposable compound (A) have any one of the following relationships (1) and (2).

$$n_B - n_A \geq 0.05 \qquad (1)$$

$$n_A - n_B \geq 0.05 \qquad (2)$$

The amount of the component (B) is preferably 10 to 90 parts by weight, more preferably 20 to 70 parts by weight based on 100 parts by weight of the total of the components (A) and (B). When the amount of the component (B) is smaller than 10 parts by weight, the refractive index changing material may become brittle and when the amount is larger than 90 parts by weight, the obtained refractive index difference may become small.

(C) Radiation Sensitive Decomposer

The radiation sensitive decomposer (C) used in the present invention can be a radiation sensitive acid generator or a radiation sensitive base generator.

The above radiation sensitive acid generator is, for example, a trichloromethyl-s-triazine, diaryl iodonium salt, triaryl sulfonium salt, quaternary ammonium salt or sulfonic acid ester.

Examples of the trichloromethyl-s-triazine include
2,4,6-tris(trichloromethyl)-s-triazine,
2-phenyl-4,6-bis(trichloromethyl)-s-triazine,
2-(4-chlorophenyl)-4,6-bis(trichloromethyl)-s-triazine,
2-(3-chlorophenyl)-4,6-bis(trichloromethyl)-s-triazine,
2-(2-chlorophenyl)-4,6-bis(trichloromethyl)-s-triazine,
2-(4-methoxyphenyl)-4,6-bis(trichloromethyl)-s-triazine,
2-(3-methoxyphenyl)-4,6-bis(trichloromethyl)-s-triazine,
2-(2-methoxyphenyl)-4,6-bis(trichloromethyl)-s-triazine,
2-(4-methylthiophenyl)-4,6-bis(trichloromethyl)-s-triazine,
2-(3-methylthiophenyl)-4,6-bis(trichloromethyl)-s-triazine,
2-(2-methylthiophenyl)-4,6-bis(trichloromethyl)-s-triazine,
2-(4-methoxynaphthyl)-4,6-bis(trichloromethyl)-s-triazine,
2-(3-methoxynaphthyl)-4,6-bis(trichloromethyl)-s-triazine,
2-(2-methoxynaphthyl)-4,6-bis(trichloromethyl)-s-triazine,
2-(4-methoxy-β-styryl)-4,6-bis(trichloromethyl)-s-triazine,
2-(3-methoxy-β-styryl)-4,6-bis(trichloromethyl)-s-triazine,
2-(2-methoxy-β-styryl)-4,6-bis(trichloromethyl)-s-triazine,
2-(3,4,5-trimethoxy-β-styryl)-4,6-bis(trichloromethyl)-s-triazine,
2-(4-methylthio-β-styryl)-4,6-bis(trichloromethyl)-s-triazine,
2-(3-methylthio-β-styryl)-4,6-bis(trichloromethyl)-s-triazine,
2-(3-methylthio-β-styryl)-4,6-bis(trichloromethyl)-s-triazine, 2-piperonyl-4,6-bis(trichloromethyl)-s-triazine,
2-[2-(furan-2-yl)ethenyl]-4,6-bis(trichloromethyl)-s-triazine, 2-[2-(5-methylfuran-2-yl)ethenyl]-4,6-bis(trichloromethyl)-s-triazine and
2-[2-(4-diethylamino-2-methylphenyl)ethenyl]-4,6-bis(trichloromethyl)-s-triazine.

Examples of the above diaryl iodonium salt include diphenyliodonium tetrafluoroborate, diphenyliodonium hexafluorophosphonate, diphenyliodonium hexafluoroarsenate, diphenyliodonium trifluoromethane sulfonate, diphenyliodonium trifluoroacetate, diphenyliodonium-p-toluene sulfonate, diphenyliodonium butyltris(2,6-difluorophenyl)borate, diphenyliodonium hexyltris(p-chlorophenyl)borate, diphenyliodonium hexyltris(3-trifluoromethylphenyl)borate, 4-methoxyphenylphenyliodonium tetrafluoroborate, 4-methoxyphenylphenyliodonium hexafluorophosphonate, 4-methoxyphenylphenyliodonium hexafluoroarsenate, 4-methoxyphenylphenyliodonium trifluoromethane sulfonate, 4-methoxyphenylphenyliodonium trifluoroacetate, 4-methoxyphenylphenyliodonium-p-toluene sulfonate, 4-methoxyphenylphenyliodonium butyltris(2,6-difluorophenyl)borate, 4-methoxyphenylphenyliodonium hexyltris(p-chlorophenyl)borate, 4-methoxyphenylphenyliodonium hexyltris(3-trifluoromethylphenyl)borate, bis(4-tert-butylphenyl)iodonium tetrafluoroborate, bis(4-tert-butylphenyl)iodonium hexafluoroarsenate, bis(4-tert-butylphenyl)iodonium trifluoromethane sulfonate, bis(4-tert-butylphenyl)iodonium trifluoroacetate, bis(4-tert-butylphenyl)iodonium-p-toluene sulfonate, bis(4-tert-butylphenyl)iodonium butyltris(2,6-difluorophenyl)borate, bis(4-tert-butylphenyl)iodonium hexyltris(p-chlorophenyl)borate and bis(4-tert-butylphenyl)iodonium hexyltris(3-trifluoromethylphenyl)borate.

Examples of the above triaryl sulfonium salt include triphenylsulfonium tetrafluoroborate, triphenylsulfonium hexafluorophosphonate, triphenylsulfonium hexafluoroarsenate, triphenylsulfonium trifluoromethane sulfonate, triphenylsulfonium trifluoroacetate, triphenylsulfonium-p-toluene sulfonate, triphenylsulfonium butyltris(2,6-difluorophenyl)borate, triphenylsulfonium hexyltris(p-chlorophenyl)borate, triphenylsulfonium hexyltris(3-trifluoromethylphenyl)borate, 4-methoxyphenyldiphenylsulfonium tetrafluoroborate, 4-methoxyphenyldiphenylsulfonium hexafluorophosphonate, 4-methoxyphenyldiphenylsulfonium hexafluoroarsenate, 4-methoxyphenyldiphenylsulfonium trifluoromethane sulfonate, 4-methoxyphenyldiphenylsulfonium trifluoroacetate, 4-methoxyphenyldiphenylsulfonium-p-toluene sulfonate, 4-methoxyphenyldiphenylsulfonium butyltris(2,6-difluorophenyl)borate, 4-methoxyphenyldiphenylsulfonium hexyltris(p-chlorophenyl)borate, 4-methoxyphenyldiphenylsulfonium hexyltris(3-trifluoromethylphenyl)borate, 4-phenylthiophenyldiphenylsulfonium tetrafluoroborate, 4-phenylthiophenyldiphenylsulfonium hexafluorophosphonate, 4-phenylthiophenyldiphenylsulfonium hexafluoroarsenate, 4-phenylthiophenyldiphenylsulfonium trifluoromethane sulfonate, 4-phenylthiophenyldiphenylsulfonium trifluoroacetate, 4-phenylthiophenyldiphenylsulfonium-p-toluene sulfonate, 4-phenylthiophenyldiphenylsulfonium butyltris(2,6-difluorophenyl)borate, 4-phenylthiophenyldiphenylsulfonium hexyltris(p-chlorophenyl)borate, 4-phenylthiophenyldiphenylsulfonium hexyltris(3-trifluoromethylphenyl)borate, 4-hydroxy-1-naphthalenyldimethylsulfonium tetrafluoroborate, 4-hydroxy-1-naphthalenyldimethylsulfonium hexafluorophosphonate, 4-hydroxy-1-naphthalenyldimethylsulfonium hexafluoroarsenate, 4-hydroxy-1-naphthalenyldimethylsulfonium trifluoromethane sulfonate, 4-hydroxy-1-naphthalenyldimethylsulfonium trifluoroacetate, 4-hydroxy-1-naphthalenyldimethylsulfonium-p-toluene sulfonate, 4-hydroxy-1-naphthalenyldimethylsulfonium butyltris(2,6-difluorophenyl)borate, 4-hydroxy-1-naphthalenyldimethylsulfonium hexyltris(p-chlorophenyl)borate and 4-hydroxy-1-naphthalenyldimethylsulfonium hexyltris(3-trifluoromethylphenyl)borate.

Examples of the above quaternary ammonium salt include tetramethylammonium tetrafluoroborate, tetramethylammonium hexafluorophosphonate, tetramethylammonium hexafluoroarsenate, tetramethylammonium trifluoromethane sulfonate, tetramethylammonium trifluoroacetate, tetramethylammonium-p-toluene sulfonate, tetramethylammonium butyltris(2,6-difluorophenyl)borate, tetramethylammonium hexyltris(p-chlorophenyl)borate, tetramethylammonium hexyltris(3-trifluoromethylphenyl)borate, tetrabutylammonium tetrafluoroborate, tetrabutylammonium hexafluorophosphonate, tetrabutylammonium hexafluoroarsenate, tetrabutylammonium trifluoromethane sulfonate, tetrabutylammonium trifluoroacetate, tetrabutylammonium-p-toluene sulfonate, tetrabutylammonium butyltris(2,6-difluorophenyl)borate, tetrabutylammonium hexyltris(p-chlorophenyl)borate, tetrabutylammonium hexyltris(3-trifluoromethylphenyl)borate, benzyltrimethylammonium tetrafluoroborate, benzyltrimethylammonium hexafluorophosphonate, benzyltrimethylammonium hexafluoroarsenate, benzyltrimethylammonium trifluoromethane sulfonate, benzyltrimethylammonium trifluoroacetate, benzyltrimethylammonium-p-toluene sulfonate, benzyltrimethylammonium butyltris(2,6-difluorophenyl)borate, benzyltrimethylammonium hexyltris(p-chlorophenyl)borate, benzyltrimethylammonium hexyltris(3-trifluoromethylphenyl)borate, benzyldimethylphenylammonium tetrafluoroborate, benzyldimethylphenylammonium hexafluorophosphonate, benzyldimethylphenylammonium hexafluoroarsenate, benzyldimethylphenylammonium trifluoromethane sulfonate, benzyldimethylphenylammonium trifluoroacetate, benzyldimethylphenylammonium-p-toluene sulfonate, benzyldimethylphenylammonium butyltris(2,6-difluorophenyl)borate, benzyldimethylphenylammonium hexyltris(p-chlorophenyl)borate, benzyldimethylphenylammonium hexyltris(3-trifluoromethylphenyl) borate, N-cinnamylideneethylphenylammonium tetrafluoroborate, N-cinnamylideneethylphenylammonium hexafluorophosphonate, N-cinnamylideneethylphenylammonium hexafluoroarsenate, N-cinnamylideneethylphenylammonium trifluoromethane sulfonate, N-cinnamylideneethylphenylammonium trifluoroacetate, N-cinnamylideneethylphenylammonium-p-toluene sulfonate, N-cinnamylideneethylphenylammonium butyltris(2,6-difluorophenyl)borate, N-cinnamylideneethylphenylammonium hexyltris(p-chlorophenyl)borate and N-cinnamylideneethylphenylammonium hexyltris(3-trifluoromethylphenyl)borate.

Examples of the above sulfonic acid ester include α-hydroxymethylbenzoin-p-toluenesulfonic acid ester, α-hydroxymethylbenzoin-trifluoromethanesulfonic acid ester, α-hydroxymethylbenzoin-methanesulfonic acid ester, pyrogallol-tri(p-toluenesulfonic acid)ester, pyrogallol-tri(trifluoromethanesulfonic acid)ester, pyrogallol-trimethanesulfonic acid ester, 2,4-dinitrobenzyl-p-toluenesulfonic acid ester, 2,4-dinitrobenzyl-trifluoromethanesulfonic acid ester, 2,4-dinitrobenzyl-methanesulfonic acid ester, 2,4-dinitrobenzyl-1,2-naphthoquinonediazido-5-sulfonic acid ester, 2,6-dinitrobenzyl-p-toluenesulfonic acid ester, 2,6-dinitrobenzyl-trifluoromethanesulfonic acid ester, 2,6-dinitrobenzyl-methanesulfonic acid ester, 2,6-dinitrobenzyl-1,2-naphthoquinonediazido-5-sulfonic acid ester, 2-nitrobenzyl-p-toluenesulfonic acid ester, 2-nitrobenzyl-trifluoromethanesulfonic acid ester, 2-nitrobenzyl-methanesulfonic acid ester, 2-nitrobenzyl-1,2-naphthoquinonediazido-5-sulfonic acid ester, 4-nitrobenzyl-p-toluenesulfonic acid ester, 4-nitrobenzyl-trifluoromethanesulfonic acid ester, 4-nitrobenzyl-methanesulfonic acid ester, 4-nitrobenzyl-1,2-naphthoquinonediazido-5-sulfonic acid ester, N-hydroxynaphthalimide-p-toluenesulfonic acid ester, N-hydroxynaphthalimide-trifluoromethanesulfonic acid ester, N-hydroxynaphthalimide-methanesulfonic acid ester, N-hydroxy-5-norbornene-2,3-dicarboxyimide-p-toluensulfonic acid ester, N-hydroxy-5-norbornene-2,3-dicarboxyimide-trifluoromethanesulfonic acid ester, N-hydroxy-5-norbornene-2,3-dicarboxyimide-methanesulfonic acid ester, 2,4,6,3',4',5'-hexahydroxybenzophenone-1,2-naphthoquinonediazido-4-sulfonic acid ester and 1,1,1-tri(p-hydroxyphenyl)ethane-1,2-naphthoquinonediazido-4-sulfonic acid ester. Out of these compounds, 2-(3-chlorophenyl)-4,6-bis(trichloromethyl)-s-triazine, 2-(4-methoxyphenyl)-4,6-bis(trichloromethyl)-s-triazine, 2-(4-methylthiophenyl)-4,6-bis(trichloromethyl)-s-triazine, 2-(4-methoxy-β-styryl)-4,6-bis(trichloromethyl)-s-triazine, 2-piperonyl-4,6-bis(trichloromethyl)-s-triazine, 2-[2-(furan-2-yl)ethenyl]-4,6-bis(trichloromethyl)-s-triazine, 2-[2-(5-methylfuran-2-yl)ethenyl]-4,6-bis(trichloromethyl)-s-triazine, 2-[2-(4-diethylamino-2-methylphenyl)ethenyl]-4,6-bis(trichloromethyl)-s-triazine and 2-(4-methoxynaphthyl)-4,6-bis(trichloromethyl)-s-triazine are preferred as trichloromethyl-s-triazines; diphenyliodonium trifluoroacetate, diphenyliodonium trifluoromethane sulfonate, 4-methoxyphenylphenyliodonium trifluoromethane sulfonate and 4-methoxyphenylphenyliodonium trifluoroacetate are preferred as diaryliodonium salts; triphenylsulfonium trifluoromethane sulfonate, triphenylsulfonium trifluoroacetate, 4-methoxyphenyldiphenylsulfonium trifluoromethane sulfonate, 4-methoxyphenyldiphenylsulfonium trifluoroacetate, 4-phenylthiophenyldiphenylsulfonium trifluoromethane sulfonate and 4-phenylthiophenyldiphenylsulfonium trifluoroacetate are preferred as triarylsulfonium salts; tetramethylammonium butyltris(2,6-difluorophenyl)borate, tetramethylammonium hexyltris(p-chlorophenyl)borate, tetramethylammonium hexyltris(3-trifluoromethylphenyl)borate, benzyldimethylphenylammonium butyltris(2,6-difluorophenyl)borate, benzyldimethylphenylammonium hexyltris(p-chlorophenyl)borate and benzyldimethylphenylammonium hexyltris(3-trifluoromethylphenyl)borate are preferred as quaternary ammonium salts; and 2,6-dinitrobenzyl-p-toluenesulfonic acid ester, 2,6-dinitrobenzyl-trifluoromethanesulfonic acid ester, N-hydroxynaphthalimide-p-toluenesulfonic acid ester and N-hydroxynaphthalimide-trifluoromethanesulfonic acid ester are preferred as sulfonic acid esters.

What are disclosed by JP-A 4-330444, "Polymer", pp. 242–248, vol. 46, No. 6 (1997) and U.S. Pat. No. 5,627,010 are advantageously used as the above radiation sensitive base generator. However, any radiation sensitive base generator is acceptable if it forms a base upon exposure to radiation.

The radiation sensitive base generator in the present invention is preferably an optically active carbamate such as triphenyl methanol, benzyl carbamate or benzoin carbamate; amide such as O-carbamoyl hydroxylamide, O-carbamoyloxime, aromatic sulfonamide, alpha-lactam or N-(2-allylethynyl)amide, or other amide; oxime ester, α-aminoacetophenone or cobalt complex.

Examples of the radiation sensitive base generator include compounds represented by the following formulas (20) to (30):

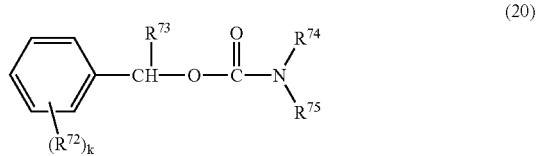
(20)

wherein $R^{72}$ is an alkyl group having 1 to 6 carbon atoms, alkoxyl group having 1 to 6 carbon atoms, thioalkyl group having 1 to 6 carbon atoms, dialkylamino group having 1 to 6 carbon atoms, piperidyl group, nitro group, hydroxy group, mercapto group, alkenyl group or alkynyl group having 2 to 6 carbon atoms, aryl group having 6 to 20 carbon atoms, fluorine atom, chlorine atom or bromine atom, k is an integer of 0 to 3, $R^{73}$ is a hydrogen atom, alkyl group having 1 to 6 carbon atoms, alkenyl group or alkynyl group having 2 to 6 carbon atoms or aryl group having 6 to 20 carbon atoms, and $R^{74}$ and $R^{75}$ are each independently a hydrogen atom, alkyl group having 1 to 6 carbon atoms, alkenyl group or alkynyl group having 2 to 6 carbon atoms, or aryl group or benzyl group having 6 to 20 carbon atoms, or $R^{74}$ and $R^{75}$ may be bonded together to form a cyclic structure having 5 to 6 carbon atoms,

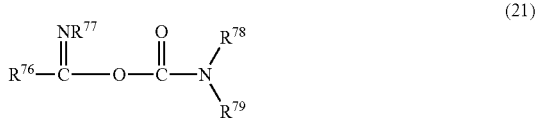
(21)

wherein $R^{76}$ is an alkyl group having 1 to 6 carbon atoms, alkoxyl group having 1 to 6 carbon atoms, thioalkyl group having 1 to 6 carbon atoms, dialkylamino group having 1 to 6 carbon atoms, piperidyl group, nitro group, hydroxy group, mercapto group, alkenyl group or alkynyl group having 2 to 6 carbon atoms or aryl group having 6 to 20 carbon atoms, $R^{77}$ is a hydrogen atom, alkyl group having 1 to 6 carbon atoms, alkenyl group or alkynyl group having 2 to 6 carbon atoms or aryl group having 6 to 20 carbon atoms, and $R^{78}$ and $R^{79}$ are each independently a hydrogen atom, alkyl group having 1 to 6 carbon atoms, alkenyl group or alkynyl group having 2 to 6 carbon atoms, or aryl group or benzyl group having 6 to 20 carbon atoms, or $R^{78}$ and $R^{79}$ may be bonded together to form a cyclic structure having 5 to 6 carbon atoms,

(22)

wherein $R^{80}$ is an alkyl group having 1 to 6 carbon atoms, alkenyl group or alkynyl group having 2 to 6 carbon atoms or aryl group having 6 to 20 carbon atoms, and $R^{81}$ and $R^{82}$ are each independently a hydrogen atom, alkyl group having 1 to 6 carbon atoms, alkenyl group or alkynyl group having 2 to 6 carbon atoms, or aryl group or benzyl group having 6 to 20 carbon atoms, or $R^{81}$ and $R^{82}$ may be bonded together to form a cyclic structure having 5 to 6 carbon atoms,

(23)

wherein $R^{83}$ and $R^{84}$ are each independently an alkyl group having 1 to 6 carbon atoms, alkenyl group or alkynyl group having 2 to 6 carbon atoms or aryl group having 6 to 20 carbon atoms,

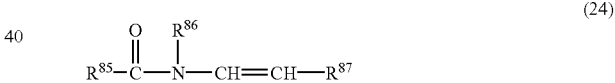
(24)

wherein $R^{85}$, $R^{86}$ and $R^{87}$ are each independently an alkyl group having 1 to 6 carbon atoms, alkenyl or alkynyl group having 2 to 6 carbon atoms or aryl group having 6 to 20 carbon atoms,

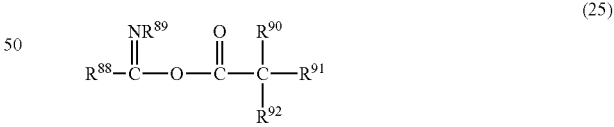
(25)

wherein $R^{88}$ is an alkyl group having 1 to 6 carbon atoms, alkoxyl group having 1 to 6 carbon atoms, thioalkyl group having 1 to 6 carbon atoms, dialkylamino group having 1 to 6 carbon atoms, piperidyl group, nitro group, hydroxy group, mercapto group, alkenyl group or alkynyl group having 2 to 6 carbon atoms or aryl group having 6 to 20 carbon atoms, $R^{89}$ is a hydrogen atom, alkyl group having 1 to 6 carbon atoms, alkenyl group or alkynyl group having 2 to 6 carbon atoms or aryl group having 6 to 20 carbon atoms, and $R^{90}$, $R^{91}$ and $R^{92}$ are each independently a hydrogen atom, alkyl group having 1 to 6 carbon atoms, alkenyl group or alkynyl group having 2 to 6 carbon atoms, or aryl group or benzyl group having 6 to 20 carbon atoms,

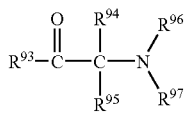
(26)

wherein $R^{93}$ is an alkyl group having 1 to 6 carbon atoms, alkoxyl group having 1 to 6 carbon atoms, thioalkyl group having 1 to 6 carbon atoms, dialkylamino group having 1 to 6 carbon atoms, piperidyl group, nitro group, hydroxy group, mercapto group, alkenyl group or alkynyl group having 2 to 6 carbon atoms or aryl group having 6 to 20 carbon atoms, $R^{94}$ and $R^{95}$ are each independently a hydrogen atom, hydroxyl group, mercapto group, cyano group, phenoxy group, alkyl group having 1 to 6 carbon atoms, fluorine atom, chlorine atom, bromine atom, alkenyl group or alkynyl group having 2 to 6 carbon atoms or aryl group having 6 to 20 carbon atoms, and $R^{96}$ and $R^{97}$ are each independently a hydrogen atom, alkyl group having 1 to 6 carbon atoms, alkenyl group or alkynyl group having 2 to 6 carbon atoms, or aryl group or benzyl group having 6 to 20 carbon atoms, or $R^{96}$ and $R^{97}$ may be bonded together to form a cyclic structure having 5 to 6 carbon atoms,

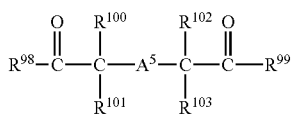
(27)

wherein $R^{98}$ and $R^{99}$ are each independently an alkyl group having 1 to 6 carbon atoms, alkoxyl group having 1 to 6 carbon atoms, thioalkyl group having 1 to 6 carbon atoms, dialkylamino group having 1 to 6 carbon atoms, piperidyl group, nitro group, hydroxy group, mercapto group, alkenyl group or alkynyl group having 2 to 6 carbon atoms or aryl group having 6 to 20 carbon atoms, $R^{100}$ to $R^{103}$ are each independently a hydrogen atom, hydroxyl group, mercapto group, cyano group, phenoxy group, alkyl group having 1 to 6 carbon atoms, fluorine atom, chlorine atom, bromine atom, alkenyl group or alkynyl group having 2 to 6 carbon atoms or aryl group having 6 to 20 carbon atoms, and $A^5$ is a divalent atomic group formed by excluding two hydrogen atoms bonded to one or two nitrogen atoms of a monoalkylamine, piperazine, aromatic diamine or aliphatic diamine,

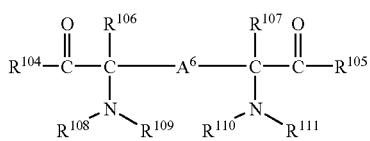
(28)

wherein $R^{104}$ and $R^{105}$ are each independently an alkyl group having 1 to 6 carbon atoms, alkoxyl group having 1 to 6 carbon atoms, thioalkyl group having 1 to 6 carbon atoms, dialkylamino group having 1 to 6 carbon atoms, piperidyl group, nitro group, hydroxy group, mercapto group, alkenyl group or alkynyl group having 2 to 6 carbon atoms or aryl group having 6 to 20 carbon atoms, $R^{106}$ and $R^{107}$ are each independently a hydrogen atom, hydroxyl group, mercapto group, cyano group, phenoxy group, alkyl group having 1 to 6 carbon atoms, fluorine atom, chlorine atom, bromine atom, alkenyl group or alkynyl group having 2 to 6 carbon atoms or aryl group having 6 to 20 carbon atoms, $R^{108}$ to $R^{111}$ are each independently a hydrogen atom, alkyl group having 1 to 6 carbon atoms, alkenyl group or alkynyl group having 2 to 6 carbon atoms, or aryl group or benzyl group having 6 to 20 carbon atoms, or $R^{108}$ and $R^{109}$ or $R^{110}$ and $R^{111}$ may be bonded together to form a cyclic structure having 5 to 6 carbon atoms, and $A^6$ is an alkylene group having 1 to 6 carbon atoms, cyclohexylene group, phenylene group or single bond,

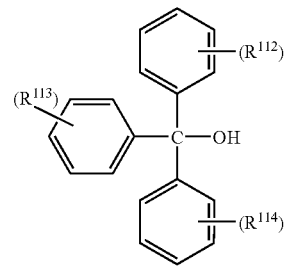
(29)

wherein $R^{112}$ to $R^{114}$ are each independently a hydrogen atom, fluorine atom, chlorine atom, bromine atom, alkyl group having 1 to 6 carbon atoms, alkenyl group having 1 to 6 carbon atoms, alkynyl group having 1 to 6 carbon atoms, alkoxyl group having 1 to 6 carbon atoms, alkenyl group or alkynyl group having 2 to 6 carbon atoms or aryl group having 6 to 20 carbon atoms, $$L_nCO^{3+}\cdot3[(R^{115})_3R^{116}]^-$$ (30)

wherein L is at least one ligand selected from the group consisting of ammonia, pyridine, imidazole, ethylenediamine, trimethylenediamine, tetramethylenediamine, hexamethylenediamine, propylenediamine, 1,2-cyclohexanediamine, N,N-diethylethylenediamine and diethylenetriamine, n is an integer of 2 to 6, $R^{115}$ is an alkenyl group or alkynyl group having 2 to 6 carbon atoms or aryl group having 6 to 20 carbon atoms, and $R^{116}$ is an alkyl group having 1 to 18 carbon atoms.

In all the above formulas (20) to (30), the alkyl group may be linear, branched or cyclic. Examples of the alkenyl group include vinyl group and propylenyl group and examples of the alkynyl group include acetylenyl group. Examples of the aryl group include phenyl group, naphthyl group and anthracenyl group, and also what contain a fluorine atom, chlorine atom, bromine atom, haloalkyl group, hydroxyl group, carboxyl group, mercapto group, cyano group, nitro group, azido group, dialkylamino group, alkoxyl group or thioalkyl group substituted for a hydrogen atom contained in the above groups.

Out of these radiation sensitive base generators, preferred are 2-nitrobenzylcyclohexyl carbamate, triphenyl methanol, o-carbamoylhydroxylamide, o-carbamoyloxime, [[(2,6-dinitrobenzyl)oxy]carbonyl]cyclohexylamine, bis[[(2-nitrobenzyl)oxy]carbonyl]hexane 1,6-diamine, 4-(methylthiobenzoyl)-1-methyl-1-morpholinoethane, (4-morpholinobenzoyl)-1-benzyl-1-dimethylaminopropane, N-(2-nitrobenzyloxycarbonyl)pyrrolidine, hexaamminecobalt(III) tris(triphenylmethylborate) and 2-benzyl-2-dimethylamino-1-(4-morpholinophenyl)-butanone.

The above radiation sensitive decomposer (C) is used in an amount of preferably 0.01 part or more by weight, more preferably 0.05 part or more by weight based on 100 parts by weight of the total of the decomposable compound (A) and the non-decomposable compound containing inorganic oxide particles (B). When the amount of the component (C) is smaller than 0.01 part by weight, sensitivity to radiation may become insufficient. The upper limit value is preferably 30 parts by weight, more preferably 20 parts by weight.

(D) Stabilizer

The refractive index changing composition of the present invention may contain (D) a stabilizer as an optional component in addition to the above components (A), (B) and (C).

The stabilizer (D) used in the present invention has the function of stabilizing the residual decomposable compound (A) contained in the refractive index changing material after exposure to radiation to provide stability to an acid or base. This stabilization prevents a change in refractive index and hence the deterioration of a refractive index pattern formed by the method of the present invention even when it is used under the condition that light having a wavelength close to the wavelength used to change the refractive index passes therethrough.

The above stabilizer (D) is selected from an amino compound, epoxy compound, thiirane compound, oxetane compound, alkoxymethyl melamine compound, alkoxymethyl glycoluril compound, alkoxymethyl benzoguanamine compound, alkoxymethyl urea compound, isocyanate compound, cyanate compound, oxazoline compound, oxazine compound and silyl compound (halogenated silyl compound and other silyl compound).

Examples of the above amino compound include triethylamine, tripropylamine, tributylamine, tripentylamine, trihexylamine, tricyclohexylamine, triphenylamine, tribenzylamine, aniline, ethylenediamine, diethylenetriamine, triethylenetetramine, tetraethylenepentamine, 1,3-diaminopropane, 1,4-diaminobutane, 1,5-diaminopentane, 1,6-diaminohexane, 1,7-diaminoheptane, 1,8-diaminooctane, 1,9-diaminononane, 1,10-diaminodecane, 1,11-diaminoundecane, 1,12-diaminododecane, 1,4-diaminocyclohexane, 1,3-cyclohexanebis(methylamine), 1,3-propane-2-ol, 2,2',2"-triaminotriethylamine, 1,4-diamino-2,2,3,3-tetrafluoropentane, 1,5-diamino-2,2,3,3,4,4-hexafluoropentane, melamine, benzoguanamine, acetoguanamine, acryloguanamine, paramine, amidol, m-phenylenediamine, p-phenylenediamine, p,p'-diaminodiphenylmethane, diaminodiphenylsulfone, 1,8-diaminonaphthalene, 3,5-diamino-1,2,4-triazole, 2-chloro-4,6-diamino-S-triazine, 2,6-diaminopyridine, 3,3'-diaminobenzidine, bis(4-aminophenyl)ether, m-xylylenediamine, p-xylylenediamine, 1,2,4,5-benzenetetramine, 2,4-diamino-1,3,5-triazine, 4,4'-diaminobenzophenone, 3,3',4,4'-tetraaminobenzophenone, triaminobenzene, 4,4'-thiodianiline, 2,3,5,6-tetrabromo-p-xylylenediamine, 2,3,5,6-tetrachloro-p-xylylenediamine, 4,5-methylenedioxy-1,2-phenylenediamine and 2,2'-bis(5-aminopyridyl)sulfide.

Examples of the above epoxy compound include bisphenol A epoxy resin, bisphenol F epoxy resin, phenol novolak epoxy resin, cresol novolak epoxy resin, cyclic aliphatic epoxy resin, bisphenol A epoxy compound and aliphatic polyglycidyl ether.

Examples of commercially available products of the above compounds are given below. Commercially available products of the bisphenol A epoxy resin include Epicoat 1001, 1002, 1003, 1004, 1007, 1009, 1010 and 828 (of Yuka Shell Epoxy Co., Ltd.), those of the bisphenol F epoxy resin include Epicoat 807 (of Yuka Shell Co., Ltd.), those of the phenol novolak epoxy resin include Epicoat 152 and 154 (of Yuka Shell Epoxy Co., Ltd.) and EPPN201 and 202 (of Nippon Kayaku Co., Ltd.), those of the cresol novolak epoxy resin include EOCN-102, EOCN-103S, EOCN-104S, EOCN-1020, EOCN-1025 and EOCN-1027 (of Nippon Kayaku Co., Ltd.) and Epicoat 180S75 (of Yuka Shell Epoxy Co., Ltd.), those of the cyclic aliphatic epoxy resin include CY175, CY177 and CY179 (of CIBA-GEIGY A.G.), ERL-4234, ERL-4299, ERL-4221 and ERL-4206 (of U.C.C. Co., Ltd.), Showdyne 509 (of Showa Denko K.K.), Araldyte CY-182, CY-192 and CY-184 (of CIBA-GEIGY A.G.), Epichlon 200 and 400 (of Dainippon Ink and Chemicals, Inc.), Epicoat 871 and 872 (of Yuka Shell Epoxy Co., Ltd.) and ED-5661 and ED-5662 (of Celanees Coating Co., Ltd.), and those of the aliphatic polyglycidyl ether include Epolite 100MF (of Kyoeisha Kagaku Co., Ltd.) and Epiol TMP (of NOF Corporation).

Besides the above compounds, phenylglycidyl ether, butylglycidyl ether, 3,3,3-trifluoromethylpropylene oxide, styrene oxide, hexafluoropropylene oxide, cyclohexene oxide, N-glycidylphthalimide, (nonafluoro-N-butyl) epoxide, perfluoroethylglycidyl ether, epichlorohydrin, epibromohydrin, N,N-diglycidylaniline and 3-[2-(perfluorohexyl)ethoxy]-1,2-epoxypropane may be advantageously used as an epoxy compound.

Examples of the above thiirane compound include what are obtained by substituting the epoxy groups of the above epoxy compounds with an ethylene sulfide group as shown in J. Org. Chem., 28, 229 (1963), for example.

Examples of the above oxetane compound include bis[(3-ethyl-3-oxetanylmethoxy)methyl]benzene (trade name of XDO, manufactured by Toagosei Chemical Industry Co., Ltd.), bis[(3-ethyl-3-oxetanylmethoxy)methyl-phenyl]methane, bis[(3-ethyl-3-oxetanylmethoxy)methyl-phenyl]ether, bis[(3-ethyl-3-oxetanylmethoxy)methyl-phenyl]propane, bis[(3-ethyl-3-oxetanylmethoxy)methyl-phenyl]sulfone, bis[(3-ethyl-3-oxetanylmethoxy)methyl-phenyl]ketone, bis[(3-ethyl-3-oxetanylmethoxy)methyl-phenyl]hexafluoropropane, tri[(3-ethyl-3-oxetanylmethoxy)methyl]benzene and tetra[(3-ethyl-3-oxetanylmethoxy)methyl]benzene.

The above alkoxymethyl melamine compound, alkoxymethyl benzoguanamine compound, alkoxymethyl glycoluril compound and alkoxymethyl urea compound are obtained by substituting the methylol groups of a methylol melamine compound, methylol benzoguanamine compound, methylol glycoluril compound and methylol urea compound with an alkoxymethyl group, respectively. The type of the alkoxymethyl group is not particularly limited, as exemplified by methoxymethyl group, ethoxymethyl group, propoxymethyl group and butoxymethyl group.

Commercially available products of the above compounds include Simel 300, 301, 303, 370, 325, 327, 701, 266, 267, 238, 1141, 272, 202, 1156, 1158, 1123, 1170 and 1174, and UFR65 and 300 (of Mitsui Cyanamid Co., Ltd.), and Nicalak Mx-750, Mx-032, Mx-706, Mx-708, Mx-40, Mx-31, Ms-11 and Mw-30 (of Sanwa Chemical Co., Ltd.).

Examples of the above isocyanate compound include phenylene-1,3-diisocyanate, phenylene-1,4-diisocyanate, 1-methoxyphenylene-2,4-diisocyanate, 1-methylphenylene-2,4-diisocyanate, 2,4-tolylene diisocyanate, 2,6-tolylene diisocyanate, 1,3-xylylene diisocyanate, 1,4-xylylene diisocyanate, biphenylene-4,4'-diisocyanate, 3,3'-dimethoxybiphenylene-4,4'-diisocyanate, 3,3'-dimethylbiphenylene-4,4'-diisocyanate, diphenylmethane-2, 4'-diisocyanate, diphenylmethane-4,4'-diisocyanate, 3,3'-dimethoxydiphenylmethane-4,4'-diisocyanate, 3,3'-dimethyldiphenylmethane-4,4'-diisocyanate, naphthylene-1,5-diisocyanate, cyclobutylene-1,3-diisocyanate, cyclopentylene-1,3-diisocyanate, cyclohexylene-1,3- diisocyanate, cyclohexylene-1,4-diisocyanate, 1-methylcyclohexylene-2,4-diisocyanate, 1-methylcyclohexylene-2,6-diisocyanate, 1-isocyanate-3,3,5-trimethyl-5-isocyanate methylcyclohexane, cyclohexane-1,3-bis(methylisocyanate), cyclohexane-1,4-bis(methylisocyanate), isophorone diisocyanate, dicyclohexylmethane-2,4'-diisocyanate, dicyclohexylmethane-4,4'-diisocyanate, ethylene diisocyanate, tetramethylene-1,4-diisocyanate, hexamethylene-1,6-diisocyanate, dodecamethylene-1,12-diisocyanate, lysine diisocyanate methyl ester and prepolymers having an isocyanate at both terminals obtained from a reaction between a stoichiometrically excessive amount of an organic diisocyanate thereof and a bifunctional active hydrogen-containing compound.

Optionally, the above diisocyanate may be used in combination with an organic polyisocyanate having 3 or more isocyanate groups, such as phenyl-1,3,5-triisocyanate, diphenylmethane-2,4,4'-triisocyanate, diphenylmethane-2,5,4'-triisocyanate, triphenylmethane-2,4',4"-triisocyanate, triphenylmethane-4,4',4"-triisocyanate, diphenylmethane-2,4,2',4'-tetraisocyanate, diphenylmethane-2,5,2',5'-tetraisocyanate, cyclohexane-1,3,5-triisocyanate, cyclohexane-1,3,5-tris(methylisocyanate), 3,5-dimethylcyclohexane-1,3,5-tris(methylisocyanate), 1,3,5-trimethylcyclohexane-1,3,5-tris(methylisocyanate), dicyclohexylmethane-2,4,2'-triisocyanate or dicyclohexylmethane-2,4,4'-triisocyanate, or a prepolymer having an isocyanate at a terminal obtained from a reaction between a stoichiometrically excessive amount of an organic polyisocyanate having 3 or more isocyanate groups and a polyfunctional active hydrogen-containing compound having 2 or more hydrogen atoms.

Examples of the above cyanate compound include 1,3-dicyanatobenzene, 1,4-dicyanatobenzene, 1,3,5-tricyanatobenzene, 1,3-, 1,4-, 1,6-, 1,8-, 2,6- or 2,7-dicyanatonaphthalene, 1,3,6-tricyanatonaphthalene, 2,2'- or 4,4'-dicyanatobiphenyl, bis(4-cyanatophenyl)methane, 2,2-bis(4-cyanatophenyl)propane, 2,2'-bis(3,5-dichloro-4-cyanatophenyl)propane, 2,2-bis(4-cyanatophenyl)ethane, bis(4-cyanatophenyl)ether, bis(4-cyanatophenyl)thioether, bis(4-cyanatophenyl)sulfone, 1,1,1,3,3,3-hexafluoro-2,2-bis(4-cyanatophenyl)propane, tris(4-cyanatophenyl)phosphite, tris(4-cyanatophenyl)phosphate and benzene polynuclear polyisocyanate compounds obtained from a reaction between a phenol resin and halogenated cyan (for example, JP-B 45-11712 and JP-B 55-9433) (the term "JP-B" as used herein means an "examined Japanese patent publication"). A divalent cyanic acid ester compound derived from a bisphenol such as 2,2-bis(4-cyanatophenyl)propane is particularly preferred because it is easily acquired, has excellent moldability and provides favorable properties to the final cured product. A polycyanate obtained by reacting an initial condensate of a phenol and formaldehyde with halogenated cyan is also useful.

Examples of the above oxazoline compound include 2,2'-bis(2-oxazoline),
4-furan-2-ylmethylene-2-phenyl-4H-oxazol-5-one,
1,4-bis(4,5-dihydro-2-oxazolyl)benzene,
1,3-bis(4,5-dihydro-2-oxazolyl)benzene,
2,3-bis(4-isopropenyl-2-oxazolin-2-yl)butane,
2,2'-bis-4-benzyl-2-oxazoline,
2,6-bis(isopropyl-2-oxazolin-2-yl)pyridine,
2,2'-isopropylidenebis(4-tert-butyl-2-oxazoline),
2,2'-isopropylidenebis(4-phenyl-2-oxazoline),
2,2'-methylenebis(4-tert-butyl-2-oxazoline) and
2,2'-methylenebis(4-phenyl-2-oxazoline).

Examples of the above oxazine compound include 2,2'-bis(2-oxazine),
4-furan-2-ylmethylene-2-phenyl-4H-oxazyl-5-one,
1,4-bis(4,5-dihydro-2-oxazyl)benzene,
1,3-bis(4,5-dihydro-2-oxazyl)benzene,
2,3-bis(4-isopropenyl-2-oxazine-2-yl)butane,
2,2'-bis-4-benzyl-2-oxazine,
2,6-bis(isopropyl-2-oxazine-2-yl)pyridine,
2,2'-isopropylidenebis(4-tert-butyl-2-oxazine),
2,2'-isopropylidenebis(4-phenyl-2-oxazine),
2,2'-methylenebis(4-tert-butyl-2-oxazine) and
2,2'-methylenebis(4-phenyl-2-oxazine).

Examples of the above halogenated silyl compound include tetrahalogenosilanes such as tetrachlorosilane, tetrabromosilane, tetraiodosilane, trichlorobromosilane and dichlorodibromosilane; monoalkyltrihalogenosilanes such as methyltrichlorosilane, methyldichlorobromosilane and cyclohexyltrichlorosilane; monoaryltrihalogenosilanes such as phenyltrichlorosilane, naphthyltrichlorosilane, 4-chlorophenyltrichlorosilane and phenyldichlorobromosilane; monoaryloxytrihalogenosilanes such as phenoxytrichlorosilane and phenoxydichlorobromosilane; monoalkoxytrihalogenosilanes such as methoxytrichlorosilane and ethoxytrichlorosilane; dialkyldihalogenosilanes such as dimethyldichlorosilane, methyl(ethyl)dichlorosilane and methyl(cyclohexyl)dichlorosilane; monoalkylmonoaryldihalogenosilanes such as methyl(phenyl) dichlorosilane; diaryldihalogenosilanes such as diphenyldichlorosilane; diaryloxydihalogenosilanes such as diphenoxydichlorosilane; monoalkylmonoaryloxydihalogenosilanes such as methyl(phenoxy)dichlorosilane; monoarylmonoaryloxydihalogenosilanes such as phenyl(phenoxy)dichlorosilane, dialkoxydihalogenosilanes such as diethoxydichlorosilane; monoalkylmonoalkoxydichlorosilanes such as methyl(ethoxy)dichlorosilane; monoarylmonoethoxydichlorosilanes such as phenyl(ethoxy)dichlorosilane; trialkylmonohalogenosilanes such as trimethylchlorosilane, dimethyl(ethyl)chlorosilane and dimethyl(cyclohexyl)chlorosilane; dialkylmonoarylmonohalogenosilanes such as dimethyl(phenyl)chlorosilane; monoalkyldiarylmonohalogenosilanes such as methyl(diphenyl)chlorosilane; triaryloxymonohalogenosilanes such as triphenoxychlorosilane; monoalkyldiaryloxymonohalogenosilanes such as methyl(diphenoxy)chlorosilane; monoaryldiaryloxymonohalogenosilanes such as phenyl(diphenoxy)chlorosilane; dialkylmonoaryloxymonohalogenosilanes such as dimethyl(phenoxy)chlorosilane; diarylmonoaryloxymonohalogenosilanes such as diphenyl(phenoxy)chlorosilane; monoalkylmonoarylmonoaryloxymonohalgenosilanes such as methyl(phenyl)(phenoxy)chlorosilane; triethoxymonohalogenosilanes such as triethoxychlorosilane; and oligomers thereof such as dimer, trimer, tetramer and pentamer of tetrachlorosilane.

Examples of the above other silyl compound include hexamethyldisilazane, t-butyldimethylchlorosilane, bis(trimethylsilyl)trifluoroacetamide, diethylaminotrimethylsilane, trimethylsilanol, hexamethyldisiloxane, chloromethyldimethylethoxysilane, acetyltriphenylsilane, ethoxytriphenylsilane, triphenylsilanol, triethylsilanol, tripropylsilanol, tributylsilanol, hexaethyldisiloxane, trimethylmethoxysilane, trimethylethoxysilane, triethylmethoxysilane, triethylethoxysilane, acetoxyethyldimethylchlorosilane, 1,3-bis(hydroxybutyl) tetramethyldisiloxane, 1,3-bis(hydroxypropyl) tetramethyldisiloxane, γ-aminopropylmethoxysilane, γ-aminopropylethoxysilane, N-β(aminoethyl)-γ-aminopropyltrimethoxysilane, N-β(aminoethyl)-γ-aminopropylmethyldimethoxysilane, N-phenyl-γ-aminopropyltrimethoxysilane, γ-anilinopropyltrimethoxysilane, γ-dibutylaminopropyltrimethoxysilane, γ-ureidopropyltriethoxysilane, N-β(N-vinylbenzylaminoethyl)-γ-aminopropyltrimethoxysilane.hydrochlorate, γ-methacryloxypropyltrimethoxysilane, γ-methacryloxypropyltriethoxysilane, vinyltrimethoxysilane, vinyltriethoxysilane, vinyltrichlorosilane, vinyltris(β-methoxyethoxy)silane, γ-glycidoxypropylmethyldiethoxysilane, γ-glycidoxypropyltriethoxysilane, γ-(3,4-epoxycyclohexyl) ethyltrimethoxysilane, γ-glycidoxypropyltrimethoxysilane, γ-mercaptopropyltrimethoxysilane, γ-chloropropyltrimethoxysilane, trimethylchlorosilane, hexamethyldisilazane, N-trimethylsilylimidazole, bis(trimethylsilyl)urea, trimethylsilylacetamide, bistrimethylsilylacetamide, trimethylsilylisocyanate, trimethylmethoxysilane, trimethylethoxysilane, methyltrimethoxysilane, methyltriethoxysilane, dimethyldimethoxysilane, dimethyldiethoxysilane, t-butyldimethylchlorosilane, t-butyldiphenylchlorosilane, triisopropylchlorosilane, n-propyltrimethoxysilane, isobutyltrimethoxysilane, n-hexyltrimethoxysilane, n-decyltrimethoxysilane, n-hexadecyltrimethoxysilane, 1,6-bis(trimethoxysilyl)hexane, dimethylsilyldiisocyanate, methylsilyltriisocyanate, phenyltrimethoxysilane, diphenyldimethoxysilane and phenylsilyltriisocyanate.

Out of these, the stabilizer (D) used in the present invention is preferably an amino compound, epoxy compound, thiirane compound, oxetane compound, oxazoline compound, oxazine compound, silyl compound, isocyanate compound or cyanate compound, more preferably an amino compound, epoxy compound, thiirane compound, oxetane compound, oxazoline compound or oxazine compound. It is particularly preferably ethylenediamine, phenylglycidyl ether, 3-phenoxypropylene sulfide, 3,3,3-trifluoropropylene oxide, hexamethyldisilazane, γ-aminopropylmethoxysilane, γ-glycidoxypropyltrimethoxysilane or methylsilyltriisocyanate.

These stabilizers (D) may be used alone or in combination of two or more. The amount of the component (D) may be excessive so that the residual decomposable compound (A) can react to the full but it is generally 10 parts or more by weight, preferably 30 parts or more by weight based on 100 parts by weight of the component (A). When the amount of the component (D) is smaller than 10 parts by weight, the stability of the refractive index changing material may become unsatisfactory due to an incomplete reaction.

A catalyst may be used in combination with the stabilizer (D). Use of the catalyst promotes a reaction between the component (D) and the residual decomposable compound (A).

The catalyst is, for example, an acidic catalyst, basic catalyst or quaternary onium salt.

Examples of the acidic catalyst include organic acids such as acetic acid, methanesulfonic acid, p-toluenesulfonic acid, trifluoroacetic acid and trifluoromethanesulfonic acid; and inorganic acids such as hydrochloric acid, sulfuric acid and nitric acid. Examples of the basic catalyst include alkali metal carbonates such as sodium carbonate, potassium carbonate and lithium carbonate; alkali metal bicarbonates such as sodium bicarbonate, potassium bicarbonate and lithium bicarbonate; alkali metal acetates such as sodium acetate; alkali metal hydrides such as lithium hydride, sodium hydride and potassium hydride; alkali metal hydroxides such as sodium hydroxide, potassium hydroxide and lithium hydroxide; alkali metal alkoxides such as sodium methoxide, sodium ethoxide, potassium t-butoxide and lithium methoxide; mercaptan alkali metals such as methyl mercaptan sodium and ethyl mercaptan sodium; organic amines such as triethylamine, tributylamine, diisopropylethylamine, N-methylmorpholine, pyridine, 4-(N,N-dimethylamino)pyridine, N,N-dimethylaniline, N,N-diethylaniline, 1,5-diazabicyclo[4.3.0]nona-5-ene, 1,4-diazabicyclo[2.2.2]octane (DABCO) and 1,8-diazabicyclo[5.4.0]undec-7-ene (DBU); alkyl lithiums such as methyl lithium, ethyl lithium and butyl lithium; and lithium alkyl amides such as lithium diisopropylamide and lithium dicyclohexylamide. Examples of the above quaternary onium salt include tetrabutylammonium chloride, tetrabutylammonium bromide, tetrabutylammonium iodide, tetrabutylammonium acetate, tetrabutylphosphonium chloride, tetrabutylphosphonium bromide, cetyltrimethylammonium bromide, tetrapropylammonium bromide and benzyltriethylammonium chloride. A combination of 18-crown-6-ether and a salt such as potassium chloride, potassium bromide, potassium iodide, cesium chloride, potassium phenoxide, sodium phenoxide or potassium benzoate may also be used as a catalyst.

Out of these, p-toluenesulfonic acid, hydrochloric acid, sulfuric acid, sodium hydroxide, potassium t-butoxide, triethylamine, DBU, tetrabutylammonium bromide, tetrabutylphosphonium bromide and 18-crown-6-ether/potassium phenoxide are preferred as a catalyst.

The amount of the catalyst is preferably 2 mols or less based on 1 equivalent of the component (D) when an amino compound, alkoxymethyl melamine compound, alkoxymethyl glycoluril compound, alkoxymethyl benzoguanamine compound, alkoxymethyl urea compound or halogenated silyl compound is used as the component (D).

When an epoxy compound, thiurane compound, oxetane compound, isocyanate compound, cyanate compound, oxazoline compound, oxazine compound or other silyl compound is used as the component (D), it is preferably used in an amount of 0.2 mol or less based on 1 equivalent of the component (D).

The number of equivalents of the component (D) is obtained by multiplying the number of reactive groups contained in the component (D) by the amount (mol) of the component (D), and the number of reactive groups is defined as follows according to the type of the component (D).
amino compound: number of nitrogen atoms
epoxy compound: number of epoxy groups
thiirane compound: number of ethylene sulfide groups
oxetane compound: number of oxetanyl groups alkoxymethyl melamine compound, alkoxymethyl glycoluril compound, alkoxymethyl benzoguanamine compound and
alkoxymethyl urea compound: number of alkoxymethyl groups
isocyanate compound: number of isocyanate group
cyanate compound: number of cyanate groups
oxazoline compound: number of oxazolyl groups
oxazine compound: number of oxazyl groups
silyl halide compound: number of halogen atoms bonded to silicon atoms
other silyl compound: number of silicon atoms <Other Components>

The refractive index changing composition of the present invention may contain other additives in limit not prejudicial to the object of the present invention. The additives include an ultraviolet light absorber, sensitizer, surfactant, heat resistance improving agent and adhesive aid.

The above ultraviolet light absorber is, for example, a benzotriazole, salicylate, benzophenone, substituted acrylonitrile, xanthene, coumarin, flavone or chalcone. Specific examples of the ultraviolet light absorber include Tinubin 234 (2-(2-hydroxy-3,5-bis($\alpha,\alpha$-dimethylbenzyl)phenyl)-2H-benzotriazole), Tinubin 571 (hydroxyphenylbenzotriazole derivative) and Tinubin 1130 (condensate of methyl-3-(3-t-butyl-5-(2H-benzotriazol-2-yl)-4-hydroxyphenyl)propionate and polyethylene glycol (molecular weight of 300)) (of Ciba Specialty Chemicals), 1,7-bis(4-hydroxy-3-methoxyphenyl)-1,6-heptadiene-3,5-dione and dibenzylidene acetone.

By adding an ultraviolet light absorber, the amount of an acid or base formed from the component (C) can be made gradually smaller as the depth from the surface of an exposed portion of the refractive index changing material of the present invention increases, which is useful as means of forming GRIN. The amount of the ultraviolet light absorber is preferably 30 parts or less by weight, more preferably 20 parts or less by weight based on 100 parts by weight of the total of the components (A) and (B).

The above sensitizer is, for example, a coumarin having a substituent at the 3-position and/or 7-position, flavone, dibenzalacetone, dibenzalcyclohexane, chalcone, xanthene, thioxanthene, porphyrin, phthalocyanine, acridine or anthracene.

The amount of the sensitizer is preferably 30 parts or less by weight, more preferably 20 parts or less by weight based on 100 parts by weight of the total of the components (A) and (B).

The above surfactant may be added to improve coatability, for example, prevent striation or improve developability.

Examples of the surfactant include nonionic surfactants such as polyoxyethylene alkyl ethers including polyoxyethylene lauryl ether, polyoxyethylene stearyl ether and polyoxyethylene oleyl ether; polyoxyethylene aryl ethers including polyoxyethylene octylphenyl ether and polyoxyethylene nonylphenyl ether; and polyethylene glycol dialkyl esters including polyethylene glycol dilaurate and polyethylene glycol distearate; fluorinated surfactants which are commercially available under the trade names of F Top EF301, EF303 and EF352 (of Shin Akita Kasei Co., Ltd.), Megafac F171, F172 and F173 (of Dainippon Ink and Chemicals, Inc.), Florade FC430 and FC431 (of Sumitomo 3M Limited), and Asahi Guard AG710, Surflon S-382, SC-101, SC-102, SC-103, SC-104, SC-105 and SC-106 (of Asahi Glass Co., Ltd.); and other surfactants which are commercially available under the trade names of organosiloxane polymer KP341 (of Shin-Etsu Chemical Co., Ltd.) and acrylic or methacrylic acid-based (co)polymer Polyflow No. 57 and No. 95 (of Kyoeisha Kagaku Co., Ltd.).

The amount of the surfactant is preferably 2 parts or less by weight, more preferably 1 part or less by weight based on 100 parts by weight of the total of the components (A) and (B).

The above adhesive aid may be added to improve adhesion to a substrate and is preferably a silane coupling agent.

The above heat resistance improving agent is an unsaturated compound such as a polyacrylate.

An antistatic agent, keeping stabilizer, halation inhibitor, anti-foaming agent, pigment and acid thermal generator may be further added to the refractive index changing composition used in the present invention as required.

<Formation of Refractive Index Pattern>

In the present invention, a refractive index pattern can be formed from the above refractive index changing composition as follows, for example.

First, the refractive index changing composition is dissolved or dispersed in a solvent to prepare a composition solution having a solid content of 5 to 70 wt %. The composition solution may be filtered with a filter having an opening diameter of about 0.1 to 10 μm as required before use.

Thereafter, this composition solution is applied to the surface of a substrate such as a silicon wafer and prebaked to remove the solvent so as to form a coating film of the refractive index changing material. Part of the formed coating film is then exposed to radiation through a pattern mask and baked after exposure (PEB) to produce a refractive index difference between exposed and unexposed portions of the refractive index changing material.

An acid or base is formed from the radiation sensitive decomposer (C) by the above exposure to act on the component (A) to decompose it. This decomposed product dissipates at the time of baking after exposure. As a result, there is produced a difference in refractive index between exposed and unexposed portions.

The solvent used to prepare a solution containing the refractive index changing composition used in the present invention uniformly dissolves or disperses the above components (A), (B) and (C), the optionally added component (D) and other additives and does not react with these components.

Examples of the solvent include alcohols such as methanol, ethanol, propanol, iso-propanol, butanol, ethylene glycol and propylene glycol; ethers such as tetrahydrofuran; glycol ethers such as ethylene glycol monomethyl ether and ethylene glycol monoethyl ether; ethylene glycol alkylether acetates such as methyl cellosolve acetate and ethyl cellosolve acetate; diethylene glycols such as diethylene glycol monomethyl ether, diethylene glycol monoethyl ether, diethylene glycol dimethyl ether, diethylene glycol ethyl methyl ether and diethylene glycol diethyl ether; propylene glycol monoalkyl ethers such as propylene glycol methyl ether, propylene glycol ethyl ether, propylene glycol propyl ether and propylene glycol butyl ether; propylene glycol alkyl ether acetates such as propylene glycol methyl ether acetate, propylene glycol ethyl ether acetate, propylene glycol propyl ether acetate and propylene glycol butyl ether acetate; propylene glycol alkyl ether acetates such as propylene glycol methyl ether propionate, propylene glycol ethyl ether propionate, propylene glycol propyl ether propionate and propylene glycol butyl ether propionate; aromatic hydrocarbons such as toluene and xylene; ketones such as methyl ethyl ketone, cyclohexanone and 4-hydroxy-4-methyl-2-pentanone; esters such as methyl acetate, ethyl acetate, propyl acetate, butyl acetate, ethyl 2-hydroxypropionate, methyl 2-hydroxy-2-methylpropionate, ethyl 2-hydroxy-2-methylpropionate, methyl hydroxyacetate, ethyl hydroxyacetate, butyl hydroxyacetate, methyl lactate, ethyl lactate, propyl lactate, butyl lactate, methyl 3-hydroxypropionate, ethyl 3-hydroxypropionate, propyl 3-hydroxypropionate, butyl 3-hydroxypropionate, methyl 2-hydroxy-3-methylbutanoate, methyl methoxyacetate, ethyl methoxyacetate, propyl methoxyacetate, butyl methoxyacetate, methyl ethoxyacetate, ethyl ethoxyacetate, propyl ethoxyacetate, butyl ethoxyacetate, methyl propoxyacetate, ethyl propoxyacetate, propyl propoxyacetate, butyl propoxyacetate, methyl butoxyacetate, ethyl butoxyacetate, propyl butoxyacetate, butyl butoxyacetate, methyl 2-methoxypropionate, ethyl 2-methoxypropionate, propyl 2-methoxypropionate, butyl 2-methoxypropionate, methyl 2-ethoxypropionate, ethyl 2-ethoxypropionate, propyl 2-ethoxypropionate, butyl 2-ethoxypropionate, methyl 2-butoxypropionate, ethyl 2-butoxypropionate, propyl 2-butoxypropionate, butyl 2-butoxypropionate, methyl 3-methoxypropionate, ethyl 3-methoxypropionate, propyl 3-methoxypropionate, butyl 3-methoxypropionate, methyl 3-ethoxypropionate, ethyl 3-ethoxypropionate, propyl 3-ethoxypropionate, butyl 3-ethoxypropionate, methyl 3-propoxypropionate, ethyl 3-propoxypropionate, propyl 3-propoxypropionate, butyl 3-propoxypropionate, methyl 3-butoxypropionate, ethyl 3-butoxypropionate, propyl 3-butoxypropionate and butyl 3-butoxypropionate; and fluorine atom-containing solvents such as trifluoromethylbenzene, 1,3-bis(trifluoromethyl) benzene, hexafluorobenzene, hexafluorocyclohexane, perfluorodimethylcyclohexane, perfluoromethylcyclohexane, octafluorodecalin and 1,1,2-trichloro-1,2,2-trifluoroethane.

Out of these solvents, alcohols, glycol ethers, ethylene glycol alkyl ether acetates, propylene glycol alkyl ether acetates, ketones, esters and diethylene glycols are preferred from the viewpoints of solubility, reactivity with each component and ease of forming a coating film.

Further, a high-boiling solvent may be used in combination with the above solvent. Examples of the high-boiling solvent include N-methylformamide, N,N-dimethylformamide, N-methylformanilide, N-methylacetamide, N,N-dimethylacetamide, N-methylpyrrolidone, dimethyl sulfoxide, benzyl ethyl ether, dihexyl ether, acetonyl acetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate and phenyl cellosolve acetate.

The refractive index changing composition used in the present invention is molded into various shapes in consideration of application purpose before exposure to radiation. For example, it is molded like a rod, fiber, long plate, sphere, film or lens to which the present invention is not limited. A commonly used method may be used to mold the refractive index changing composition of the present invention. For example, injection molding, compression molding, blow molding, extrusion, in-case frame polymerization, shaving, drawing, heating/cooling, CVD deposition, sintering or scanning may be employed. According to the application purpose of an optically molded product, spin coating, slitting, bar coating, solvent casting, LB, spraying, roll coating, relief-printing or screen printing may also be used.

In this molding process, heating (to be referred to as "prebaking" hereinafter) is preferably carried out. The heating condition which changes according to the composition of the material of the present invention and the type of each additive is preferably 30 to 200° C., more preferably 40 to 150° C. A hot plate or oven, or infrared radiation may be used for heating.

The radiation used for exposure is an i-ray having a wavelength of 365 nm, h-ray having a wavelength of 404 nm, g-ray having a wavelength of 436 nm, ultraviolet radiation from a wide wavelength light source such as a xenon lamp, far ultraviolet radiation such as a KrF excimer laser beam having a wavelength of 248 nm or an ArF excimer laser beam having a wavelength of 193 nm, X-radiation such as synchrotron radiation, charged corpuscular beam such as electron beam, visible radiation or a mixture thereof. Out of these, ultraviolet radiation and visible radiation are preferred. The illuminance which depends on the wavelength of the radiation is preferably 0.1 to 100 mW/cm$^2$ because the highest reaction efficiency is obtained. Exposure to the above radiation through a pattern mask makes possible the patterning of the radiation sensitive refractive index changing material. As for patterning accuracy which is affected by a light source used, an optical part having a refractive index variation distribution with a resolution of about 0.2 μm can be produced.

In the present invention, heating (to be referred to as "post-exposure baking (PEB)") is preferably carried out after exposure. A similar device to the above prebaking device may be used for PEB and PEB conditions may be arbitrary. The heating temperature is preferably 30 to 150° C., more preferably 30 to 130° C.

When the refractive index changing composition of the present invention does not contain the optional component (D), stabilization with the stabilizer (D) is then preferably carried out.

The stabilizer (D) used in the present invention has the function of stabilizing the residual decomposable compound (A) contained in the refractive index changing composition after exposure to provide stability to an acid or base. This stabilization prevents a change in refractive index and hence the deterioration of a refractive index pattern formed by the method of the present invention even when it is used under the condition that light having a wavelength close to the wavelength used to change the refractive index passes therethrough.

Examples of the above stabilizer (D) include an amino compound, epoxy compound, thuirane compound, oxetane compound, alkoxymethyl melamine compound, alkoxymethyl glycoluril compound, alkoxymethyl benzoguanamine compound, alkoxymethyl urea compound, isocyanate compound, cyanate compound, oxazoline compound, oxazine compound, halogenated silyl compound and other silyl compound.

Specific examples of these compounds are the same as those listed for the above stabilizer (D). Besides the above amino compounds, a low-boiling compound such as ammonia or triethylamine may be used as the amino compound.

These stabilizers (D) may be used alone or in combination of two or more. The amount of the component (D) may be excessive so that the residual decomposable compound (A) can react to the full but it is generally 10 parts or more by weight, preferably 15 parts or more by weight based on 100 parts by weight of the component (A). When the amount of the component (D) is smaller than 10 parts by weight, the stability of the refractive index changing material may become unsatisfactory due to an incomplete reaction.

A catalyst may be used in combination with the stabilizer (D). Use of the catalyst promotes a reaction between the component (D) and the residual decomposable compound (A).

Examples of the catalyst are the same as those listed for the catalyst described for the stabilizer (D).

For contact between the refractive index changing composition after exposure to radiation and the stabilizer (D) for stabilization, a suitable method may be employed. For instance, the component (D) and optionally a catalyst are dissolved in a suitable solvent to be contacted to the refractive index changing composition as a solution. Alternatively, when the component (D) is liquid or gas under contact conditions, it may be 100% directly contacted to the refractive index changing composition.

When a solvent is used in the reaction between the above stabilizer (D) and the component (A), the solvent preferably dissolves the component (D) and an optionally added catalyst and does not dissolve the component (A). If the above solvent is selected, the surface of the obtained refractive index pattern will not be roughened.

Examples of the solvent include water; alcohols such as methanol, ethanol, iso-propanol, n-propanol, n-butanol, iso-butanol, tert-butanol, cyclohexanol, ethylene glycol, propylene glycol and diethylene glycol; ethers such as diethyl ether and tetrahydrofuran; glycol ethers such as ethylene glycol monomethyl ether and ethylene glycol monoethyl ether; ethylene glycol alkyl ether acetates such as methyl cellosolve acetate and ethyl cellosolve acetate; diethylene glycols such as diethylene glycol monomethyl ether, diethylene glycol monoethyl ether and diethylene glycol dimethyl ether; propylene glycol monoalkyl ethers such as propylene glycol methyl ether and propylene glycol ethyl ether; propylene glycol alkyl ether acetates such as propylene glycol methyl ether acetate and propylene glycol ethyl ether acetate; propylene glycol alkyl ether acetates such as propylene glycol methyl ether propionate, propylene glycol ethyl ether propionate, propylene glycol propyl ether propionate and propylene glycol butyl ether propionate; aromatic hydrocarbons such as toluene and xylene; aliphatic hydrocarbons such as n-hexane, n-heptane and n-octane; ketones such as methyl ethyl ketone, cyclohexanone, methyl isobutyl ketone, methylamyl ketone and 4-hydroxy-4-methyl-2-pentanone; esters such as ethyl acetate, propyl acetate, butyl acetate, ethyl 2-hydroxypropionate, methyl 2-hydroxy-2-methylpropionate, ethyl hydroxyacetate, butyl hydroxyacetate, ethyl lactate, propyl lactate, butyl lactate, methyl 3-hydroxypropionate, methyl 2-hydroxy-3-methylbutanoate, ethyl methoxyacetate, butyl methoxyacetate, ethyl 2-methoxypropionate, butyl 2-methoxypropionate, butyl 2-ethoxypropionate, butyl 2-butoxypropionate, butyl 3-methoxypropionate, butyl 3-ethoxypropionate, butyl 3-propoxypropionate and butyl 3-butoxypropionate; fluorine atom-containing solvents such as trifluoromethylbenzene, 1,3-bis(trifluoromethyl)benzene, hexafluorobenzene, hexafluorocyclohexane, perfluorodimethylcyclohexane, perfluoromethylcyclohexane, octafluorodecalin and 1,1,2-trichloro-1,2,2-trifluoroethane; and aprotic polar solvents such as dimethyl formamide, dimethyl sulfoxide, dimethyl acetamide and N-methylpyrrolidone.

Out of these solvents, water, alcohols, glycol ethers, ethylene glycol alkyl ether acetates and fluorine atom-containing solvents are preferred.

The reaction temperature for carrying out a reaction between the stabilizer (D) and the residual decomposable compound (A) is generally 0 to 130° C., and the reaction time is generally 10 seconds to 1 hour.

When the refractive index changing composition of the present invention contains the stabilizer (D) as an optional component, heating is preferably carried out for the stabilization of a reaction between the residual component (A) and the component (D) successively after post-exposure baking or separately. The heating temperature for stabilization is preferably 35 to 200° C., more preferably a temperature 10° C. or more higher than the PEB temperature, much more preferably a temperature 20° C. or more higher than the PEB temperature.

Further, re-exposure may be carried out to decompose the residual component (C) existent in the unexposed portion and further improve the stability of the material.

The re-exposure may be carried out by applying radiation having the same wavelength as the radiation used to change the refractive index to the entire surface of the pattern in the same amount.

Optionally, heating may be further carried out to further improve the stability of the material. A similar device to the prebaking device used at the time of molding the material may be used for heating and the heating conditions may be arbitrary. In the refractive index pattern formed as described above of the present invention, the refractive index of the exposed portion is higher than that of the unexposed portion. This difference can be adjusted to a desired value by controlling the types and contents of the components (A) and (B) in the refractive index changing material used in the present invention. For example, the maximum value of refractive index difference can be adjusted to a value larger than 0.02.

Since the refractive index pattern of the present invention does not deteriorate without a change in refractive index even when it is used under the condition that light having a wavelength close to the wavelength used to change the refractive index passes therethrough as described above, it is extremely useful as an optical material for use in optoelectronic and display fields.

EXAMPLES

The following examples are provided for the purpose of further illustrating the present invention but are in no way to be taken as limiting.

The weight average molecular weight in terms of polystyrene of each compound was measured using the GPC CHROMATOGRAPH SYSTEM-21 of Showa Denko K.K.

Synthesis Examples of Component (A)

Synthesis Example 1 of Component (A)

63.62 g of 3,3,4,4,5,5,5-heptafluoropentanaldehyde and 500 g of tetrahydrofuran were fed to a 1-liter flask whose inside had been substituted with nitrogen and cooled to −78° C. 0.64 g of a boron trifluoride ether complex was added to the resulting solution and stirred in a nitrogen atmosphere at −78° C. for 48 hours.

0.8 g of acetic anhydride and 0.6 g of pyridine were added to the obtained reaction solution under cooling and then stirred at −78° C. for 2 hours. The reaction solution was wholly concentrated to 100 ml by heating at 60° C. under reduced pressure and injected continuously into 5 liters of ion exchange water in 10 minutes. The precipitate was re-dissolved in 50 parts by weight of tetrahydrofuran, purified by re-precipitation with 5 liters of ion exchange water and vacuum dried at 50° C. to obtain 43.31 g of a compound (A-1). The weight average molecular weight of the obtained compound was 2,700.

Synthesis Example 2 of Component (A)

A solution prepared by dissolving 83.08 g of hexafluoroglutaric acid dichloride in 400 ml of chloroform was fed to a 1-liter three-necked flask in an argon atmosphere, and a solution prepared by dissolving 18.62 g of ethylene glycol and 33.66 g of potassium hydroxide in 200 ml of ion exchange water was added to the resulting solution and stirred to carry out interfacial polycondensation. After 6 hours of the reaction, the reaction solution was purified twice by re-precipitation with tetrahydrofuran-methanol.

The precipitated polymer was separated by filtration and vacuum dried at 50° C. to obtain 59.87 g of a compound (A-2). The weight average molecular weight of the obtained compound was 16,700.

Synthesis Example 3 of Component (A)

50 parts by weight of o-phthalaldehyde as a monomer and 500 parts by weight of tetrahydrofuran were fed to a 1-liter flask whose inside had been substituted with nitrogen and cooled to −78° C. 1.0 part by weight of an n-hexane solution of n-butyl lithium (1.5 mols/l) was added to this flask and stirred in a nitrogen atmosphere under cooling at −78° C. for 48 hours.

0.8 part by weight of acetic anhydride and 0.6 part by weight of pyridine were added to the obtained reaction solution under cooling and then stirred at −78° C. for 2 hours. The reaction solution was concentrated to 100 ml by heating at 60° C. under reduced pressure and injected into 5 liters of ion exchange water in 10 minutes. The precipitate was re-dissolved in 50 parts by weight of tetrahydrofuran, purified by re-precipitation with 5 liters of ion exchange water and vacuum dried at 50° C. to obtain 45 parts by weight of a compound (A-3). The weight average molecular weight of the obtained compound was 26,000.

Synthesis Example 4 of Component (A)

61.51 g of terephthalic acid chloride was dissolved in 150 ml of chloroform in a 500-ml three-necked flask in an argon atmosphere. A solution prepared by dissolving 33.05 g of 1,4-benzenethiol and 33.66 g of potassium hydroxide in 150 ml of ion exchange water was added to the resulting solution and stirred to carry out interfacial polycondensation. After 6 hours of the reaction, the reaction solution was purified twice by re-precipitation with tetrahydrofuran-methanol.

The precipitated compound was separated by filtration and vacuum dried at 50° C. to obtain 75.98 g of a compound (A-4). The weight average molecular weight of the obtained compound was 33,600.

Synthesis Examples of Component (B)

Synthesis Example 1 of Component (B)

39.66 g of phenyltrimethoxysilane and 24.44 g of diphenyldimethoxysilane were dissolved in 100 g of ethylene glycol ethyl methyl ether in a 1-liter three-necked flask and the obtained solution was heated at 70° C. under stirring with a magnetic stirrer. 5.20 g of ion exchange water was continuously added to the solution in 1 hour. After 4 hours of a reaction at 70° C., the obtained reaction solution was cooled to room temperature. Thereafter, 9.20 g of methanol which was a reaction by-product was distilled off from the reaction solution under reduced pressure. The weight average molecular weight of the obtained polymer (B-1) was 1,600. 54.90 g of a zirconia sol in a methyl ethyl ketone solvent (average particle diameter of 0.01 to 0.05 μm, zirconia concentration of 30%) was added to this polymer. The solid content of the obtained inorganic oxide particle mixed solution (Bmix-1) was 31.3%.

Synthesis Example 2 of Component (B)

54.90 g of a titanium oxide sol of a methyl ethyl ketone solvent(average particle diameter of 0.01 to 0.05 μm, titanium oxide concentration of 30%) was added to the compound (B-1) obtained in Synthesis Example 1. The solid content of the obtained inorganic oxide particle mixed solution (Bmix-2) was 31.3%.

Synthesis Example 3 of Component (B)

54.90 g of a tin oxide sol of a methyl ethyl ketone solvent(average particle diameter of 0.01 to 0.05 μm, antimony pentaoxide concentration of 30%) was added to the compound (B-1) obtained in Synthesis Example 1. The solid content of the obtained inorganic oxide particle mixed solution (Bmix-3) was 31.3%.

Synthesis Example 4 of Component (B)

54.90 g of a methanol dispersed alumina sol (average particle diameter of 0.0015 to 0.003 μm, solid content of 30%, water content of 5.6%) was added to the compound (B-1) obtained in Synthesis Example 1. The solid content of the obtained inorganic oxide particle mixed solution (Bmix-4) was 31.3%.

Synthesis Example 5 of Component (B)

15.22 g of tetramethoxysilane and 27.24 g of methyltrimethoxysilane were placed in a 1-liter three-necked flask, 100 g of ethylene glycol ethyl methyl ether was added to the flask to dissolve them, and the obtained mixed solution was heated at 60° C. under stirring with a magnetic stirrer. 5.20 g of ion exchange water was continuously added to the mixed solution in 1 hour. After 4 hours of a reaction at 60° C., the obtained reaction solution was cooled to room temperature. Thereafter, 9.20 g of methanol which was a reaction by-product was distilled off from the reaction solution under reduced pressure. The weight average molecular weight of the obtained compound (B-2) was 1,600. 54.90 g of a silica sol in a methyl ethyl ketone solvent (average particle diameter of 0.01 to 0.05 μm, silica concentration of 30%) was added to the compound. The solid content of the obtained inorganic oxide particle mixed solution (Bmix-5) was 31.3%.

Example 1

50 parts by weight of the compound (A-1) as the component (A), 50 parts by weight in terms of solid content of the inorganic oxide particle mixed solution (Bmix-1) as the component (B) and 1 part by weight of 2-(4-methoxyphenyl)-bis(4,6-trichloromethyl)-s-triazine as the component (C) were dissolved in diethylene glycol ethyl methyl ether to a total solids content of 20 wt %, and the resulting solution was filtered with a membrane filter having an opening diameter of 0.2 μm to prepare a refractive index changing composition.
(1) Formation of a Coating Film The above composition was applied to a silicon substrate with a spinner and prebaked on a hot plate at 90° C. for 2 minutes to form a 1.0 μm-thick coating film.
(2) Formation of a Refractive Index Pattern The coating film obtained as described above was exposed to 100 mJ/cm$^2$ of radiation at the optimum focusing depth with the NSR1505i6A reduction projection exposure device (of Nikon Corporation, NA=0.45, λ=365 nm) through a pattern mask. The coating film was then baked at 130° C. for 2 minutes after exposure to form a refractive index pattern having a refractive index difference between exposed and unexposed portions. As for the refractive index pattern formed herein, the exposed portion will be referred to as "refractive index changed portion" and the unexposed portion will be referred to as "refractive index unchanged portion" hereinafter.
(3) Measurement of Refractive Index The refractive indices of the refractive index changed portion and the refraction index unchanged portion of the refractive index pattern formed above were measured at 633 nm with the Auto EL IV NIR III ellipsometer (of Rudolf Research Co., Ltd.). The results are shown in Table 1.
(4) Evaluation of Transparency A refractive index pattern was formed on a glass substrate in the same manner as in (1) and (2) except that the Corning 1737 glass substrate (of Corning Co., Ltd.) was used in place of the silicon substrate. The exposed portion of the refractive index pattern formed on the glass substrate will be referred to as "refractive index changed portion" and the unexposed portion will be referred to as "refractive index unchanged portion" hereinafter as well.

Thereafter, the transmittances of the refractive index changed portion and the refractive index unchanged portion of the refractive index pattern formed on the glass substrate were measured at a wavelength of 400 to 800 nm with the 150-20 double beam spectrophotometer (of Hitachi, Ltd.). It can be said that when the minimum transmittance exceeds 95%, the transmittance is satisfactory and when the minimum transmission is 95% or less, the transmittance is unsatisfactory. The results are shown in Table 1.
(5) Stabilization A 20% dimethyl formamide solution of 2,2,3,3,4,4,4-heptafluorobutyloxysilane (containing 10 mol % of tetrabutylammonium bromide) as the component (D) was heated at 100° C., and the refractive index patterns formed on the silicon substrate and the glass substrate as described above were immersed in the solution at 100° C. for 2 minutes and then washed with super pure water for 1 minute.

Then, the entire surfaces of the patterns were re-exposed to 4.5 mW/cm$^2$ of radiation using the Canon PLA-501F without a filter for 1 minute and heated in an oven at 200° C. for 10 minutes to stabilize the refractive index patterns.

(6) Evaluation of Refractive Index and Transparency

The refractive indices of the refractive index changed portion and the refractive index unchanged portion of the above stabilized refractive index pattern formed on the silicon substrate were measured in the same manner as in (3) above. The results are shown in Table 2.

The transparencies of the refractive index changed portion and the refractive index unchanged portion of the above stabilized refractive index pattern formed on the glass substrate were measured in the same manner as in (4) above. The results are shown in Table 2.

(7) Evaluation of Stability of Refractive Index Pattern

The entire surface of the above stabilized refractive index pattern formed on the silicon substrate and the entire surface of the above stabilized refractive index pattern formed on the glass substrate were exposed to 4.5 mW/cm² of radiation for 30 minutes using the Canon PLA-501F without a filter to carry out the acceleration of exposure to radiation.

The refractive indices of the refractive index changed portion and the refractive index unchanged portion of the thus treated refractive index pattern formed on the silicon substrate were measured in the same manner as in (3) above. The results are shown in Table 2.

The transparencies of the refractive index changed portion and the refractive index unchanged portion of the stabilized refractive index pattern formed on the glass substrate were measured in the same manner as in (4) above. The results are shown in Table 2.

Example 2

Evaluations were carried out in the same manner as in Example 1 except that 50 parts by weight in terms of solid content of the inorganic oxide particle mixed solution (Bmix-2) was used as the component (B), the PEB temperature in the step (2) (formation of a refractive index pattern) was changed as shown in Table 1, and the type of the component (D) and the stabilization temperature in the step (5) (stabilization) were changed as shown in Table 2. The results are shown in Table 1 and Table 2.

Example 3

Evaluations were carried out in the same manner as in Example 1 except that 50 parts by weight of the compound (A-2) was used as the component (A), 50 parts by weight in terms of solid content of the inorganic oxide particle mixed solution (Bmix-3) was used as the component (B), 5 parts by weight of N-(2-nitrobenzyloxycarbonyl)pyrrolidine was used as the component (C), the PEB temperature in the step (2) (formation of a refractive index pattern) was changed as shown in Table 1, and the type of the component (D) and the stabilization temperature in the step (5) (stabilization) were changed as shown in Table 2. The results are shown in Table 1 and Table 2.

Example 4

Evaluations were carried out in the same manner as in Example 1 except that 50 parts by weight of the compound (A-2) was used as the component (A), 50 parts by weight in terms of solid content of the inorganic oxide particle mixed solution (Bmix-4) was used as the component (B), 5 parts by weight of N-(2-nitrobenzyloxycarbonyl)pyrrolidine was used as the component (C), the PEB temperature in the step (2) (formation of a refractive index pattern) was changed as shown in Table 1, and the type of the component (D) and the stabilization temperature in the step (5) (stabilization) were changed as shown in Table 2. The results are shown in Table 1 and Table 2.

Example 5

Evaluations were carried out in the same manner as in Example 1 except that 50 parts by weight of the compound (A-3) was used as the component (A), 50 parts by weight in terms of solid content of the inorganic oxide particle mixed solution (Bmix-5) was used as the component (B), the amount of exposure in the step (2) (formation of a refractive index pattern) was changed as shown in Table 1, and the type of the component (D) in the step (5) (stabilization) was changed as shown in Table 2. The results are shown in Table 1 and Table 2.

Example 6

Evaluations were carried out in the same manner as in Example 1 except that 50 parts by weight of the compound (A-4) was used as the component (A), 50 parts by weight in terms of solid content of the inorganic oxide particle mixed solution (Bmix-5) was used as the component (B), 5 parts by weight of N-(2-nitrobenzyloxycarbonyl)pyrrolidine was used as the component (C), the amount of exposure in the step (2) (formation of a refractive index pattern) was changed as shown in Table 1, and the type of the component (D) in the step (5) (stabilization) was changed as shown in Table 2. The results are shown in Table 1 and Table 2.

TABLE 1

|  | Refractive index pattern forming conditions | | optical properties before stabilization | | | |
|---|---|---|---|---|---|---|
|  | Amount of | PEB | refractive index | | transparency | |
|  | exposure (mJ/cm²) | temperature (° C.) | Refractive index changed portion | refractive index unchanged portion | Refractive index changed portion | refractive index unchanged portion |
| Ex. 1 | 40 | 110 | 1.75 | 1.56 | 96.6% | 96.3% |
| Ex. 2 | 40 | 110 | 1.74 | 1.56 | 95.8% | 95.4% |
| Ex. 3 | 40 | 110 | 1.70 | 1.54 | 96.6% | 96.3% |
| Ex. 4 | 90 | 90 | 1.62 | 1.50 | 95.8% | 95.4% |
| Ex. 5 | 30 | 130 | 1.43 | 1.51 | 98.7% | 98.4% |
| Ex. 6 | 80 | 130 | 1.43 | 1.55 | 99.0% | 98.6% |

Ex.: Example

TABLE 2

| | Stabilization conditions | | optical properties after stabilization | | | |
| --- | --- | --- | --- | --- | --- | --- |
| | | | Refractive index | | transparency | |
| | Type of component (D) | temperature | Refractive index changed portion | refractive index unchanged portion | Refractive index changed portion | refractive index unchanged portion |
| Ex. 1 | D-1 | 100° C. | 1.76 | 1.57 | 96.7% | 96.4% |
| Ex. 2 | D-1 | 100° C. | 1.75 | 1.57 | 96.0% | 95.6% |
| Ex. 3 | D-2 | 20° C. | 1.70 | 1.54 | 96.6% | 96.3% |
| Ex. 4 | D-2 | 20° C. | 1.62 | 1.50 | 95.8% | 95.4% |
| Ex. 5 | D-3 | 100° C. | 1.43 | 1.51 | 98.7% | 98.4% |
| Ex. 6 | D-3 | 100° C. | 1.43 | 1.55 | 99.0% | 98.6% |

| | optical properties after acceleration of exposure | | | |
| --- | --- | --- | --- | --- |
| | Refractive index | | transparency | |
| | Refractive index changed portion | refractive index unchanged portion | Refractive index changed portion | refractive index unchanged portion |
| Ex. 1 | 1.76 | 1.57 | 96.7% | 96.4% |
| Ex. 2 | 1.75 | 1.57 | 96.0% | 95.6% |
| Ex. 3 | 1.70 | 1.54 | 96.6% | 96.3% |
| Ex. 4 | 1.62 | 1.50 | 95.8% | 95.4% |
| Ex. 5 | 1.43 | 1.51 | 98.7% | 98.4% |
| Ex. 6 | 1.43 | 1.55 | 99.0% | 98.6% |

Ex.: Example

In Table 2, symbols for the component (D) denote the following.
D-1: 20% dimethyl formamide solution of 2,2,3,3,4,4,4-heptafluorobutyloxysilane (containing 10 mol % of tetrabutylammonium bromide)
D-2: 1% aqueous solution of ethylenediamine
D-3: 20% dimethyl formamide solution of bisphenol A diglycidyl ether (containing 10 mol % of tetrabutylammonium bromide)

Example 7

A refractive index changing composition was prepared in the same manner as in Example 1 except that 15 parts by weight of glycerol diglycidyl ether (D) was further added. A coating film was formed in the same manner as in the step (1) of Example 1 using the above composition and exposed to radiation in the same manner as in the former stage of the step (2). Thereafter, the film was baked after exposure at 110° C. for 2 minutes and then stabilized at 130° C. for 10 minutes. As for the formed refractive index pattern, the exposed portion is referred to as "refractive index changed portion" and the unexposed portion is referred to as "refractive index unchanged portion".

The refractive index and transparency of the refractive index pattern formed as described above were evaluated in the same manner as in the step (3) and the step (4) of Example 1, respectively. The results are shown in Table 3. Further, the stability of the refractive index pattern formed above was evaluated in the same manner as in the step (7) of Example 1. The results are shown in Table 3.

TABLE 3

| | optical properties after stabilization | | | |
| --- | --- | --- | --- | --- |
| | Refractive index | | transparency | |
| | Refractive index changed portion | refractive index unchanged portion | Refractive index changed portion | refractive index unchanged portion |
| Ex. 7 | 1.76 | 1.58 | 96.7% | 96.2% |

| | optical properties after acceleration of exposure | | | |
| --- | --- | --- | --- | --- |
| | Refractive index | | transparency | |
| | Refractive index changed portion | refractive index unchanged portion | Refractive index changed portion | refractive index unchanged portion |
| Ex. 7 | 1.76 | 1.57 | 96.7% | 96.4% |

Ex.: Example

EFFECT OF THE INVENTION

Since the refractive index pattern formed by the method of the present invention has a sufficiently large refractive index difference and the obtained refractive index difference is stable to light and heat, it is extremely useful as an optical material for use in optoelectronic and display fields. The refractive index pattern of the present invention is further used as an optical material for photoarrays, lenses, photocouplers, photointerruptors, polarization beam splitters, holograms, single-mode and multi-mode optical fibers, bundle fibers, light guides, single-core, multi-core and photoelectric coupling optical connectors, optical isolators, polarizers, optical sensors such as photodiodes, phototransistors, photo-ICs, CCD image sensors, CMOS image sensors, optical fiber sensors and optical fiber gyros, optical disks such as CD, LD, PD and DVD, optical switches, waveguides, optical touch panels, diffraction gratings, optical guide plates, optical diffusers, anti-reflectors and optical sealers.

We claim:

1. A radiation sensitive refractive index changing composition, comprising:
   (A) a decomposable compound, (B) a non-decomposable component containing inorganic oxide particles, and (C) a radiation sensitive decomposer,
   wherein the relationship between the refractive index $n_A$ of the component (A) and the refractive index $n_B$ of the component (B) satisfies either one of the following expressions (1) and (2):

$$n_B - n_A \geq 0.05 \qquad (1)$$

$$n_A - n_B \geq 0.05 \qquad (2).$$

2. The composition of claim 1 which further comprises (D) a stabilizer.

3. The composition of claim 1, wherein the decomposable compound (A) is a compound having at least one structure selected from the group consisting of structures represented by the following formulas (1) to (6), (10) and (11) to (14):

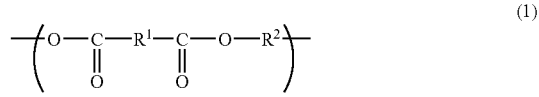

(1)

wherein $R^1$ is an alkylene group, perfluoroalkylene group, alkylsilylene group, alkylene-arylene-alkylene group or arylene group, and $R^2$ is an alkylene group, perfluoroalkylene group, alkylene-arylene-alkylene group, arylene group, alkylsilylene group or alkylgermylene group, where each of the above alkylene groups and perfluoroalkylene groups optionally contains, a —O—, —CO—, —COO— or —OCOO— bond,

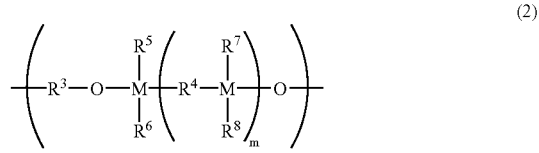

(2)

wherein M is Si or Ge, $R^3$ is an alkylene group, perfluoroalkylene group, alkylene-arylene- alkylene group, arylene group, alkylsilylene group, alkylgermylene group or single bond, $R^4$ is an oxygen atom, alkylene group; perfluoroalkylene group, alkylene-arylene-alkylene group, arylene group, alkylsilylene group or single bond, $R^5$, $R^6$, $R^7$ and $R^8$ are each independently a hydrogen atom, alkyl group, aryl group, alkoxyl group, thioalkyl group, alkoxyester group, perfluoroalkyl group, perfluoroalkoxyl group, perfluoroalkoxyester group or perfluoroaryl group, and m is an integer of 0 to 2, where each of the above alkylene groups and perfluoroalkylene groups optionally contains a —O—, —CO—, —COO— or —OCOO— bond,

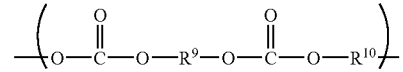

(3)

wherein $R^9$ and $R^{10}$ are each independently an alkylene group, perfluoroalkylene group, alkylene-arylene-alkylene group, arylene group, alkylsilylene group or alkylgermylene group, where each of the above alkylene groups and perfluoroalkylene groups optionally contains a —O—, —CO—, —COO— or —OCOO— bond,

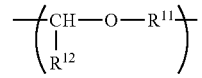

(4)

wherein $R^{11}$ is an oxyalkylene group or single bond, and $R^{12}$ is a hydrogen atom, alkyl group, alkoxyl group, alkoxyester group, perfluoroalkyl group, perfluoroalkoxyester group, perfluoroaryl group, alkylene-arylene-alkylene group or aryl group,

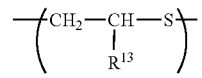

(5)

wherein $R^{13}$ is a hydrogen atom, alkyl group, alkoxyl group, alkoxyester group, perfluoroalkyl group, perfluoroalkoxyl group, perfluoroalkoxyester group, perfluoroaryl group or aryl group,

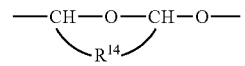

(6)

wherein $R^{14}$ is an alkylene group or a structure represented by the following formula (7), (8) or (9):

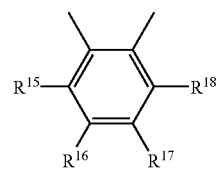

(7)

wherein $R^{15}$, $R^{16}$, $R^{17}$ and $R^{18}$ are each independently a hydrogen atom, chain alkyl group having 1 to 6 carbon atoms, chlorine atom, bromine atom, iodine atom, hydroxyl group, mercapto group, carboxyl group, alkoxyl group having 1 to 6 carbon atoms, alkylthio group having 1 to 6 carbon atoms, haloalkyl group having 1 to 6 carbon atoms, haloalkoxyl group having 1 to 6 carbon atoms, haloalkylthio group having 1 to 6 carbon atoms, hydroxyalkyl group having 1 to 6 carbon atoms, mercaptoalkyl group having 1 to 6 carbon atoms, hydroxyalkoxyl group having 1 to 6 carbon atoms, mercaptoalkylthio group having 1 to 6 carbon atoms, aryl group having 6 to 10 carbon atoms or aralkyl group having 7 to 11 carbon atoms,

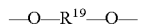

(8)

wherein $R^{19}$ is an alkylene group,

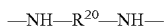 (9)

wherein $R^{20}$ is an alkylene group,

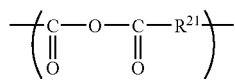 (10)

wherein $R^{21}$ is an alkylene group, alkylene-arylene-alkylene group or arylene group,

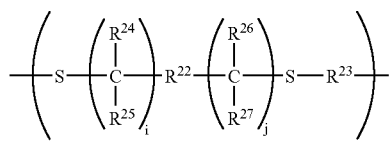 (11)

wherein $R^{22}$ is an alkylene group, aralkylene group or arylene group, $R^{23}$ is an alkylene group, aralkylene group, arylene group, alkylene-arylene-alkylene group, alkylsilylene group or alkylgermylene group, $R^{24}$, $R^{25}$, $R^{26}$ and $R^{27}$ are each independently a hydrogen atom, alkyl group, aryl group, alkoxyl group or thioalkyl group, and i and j are each independently 0 or 1,

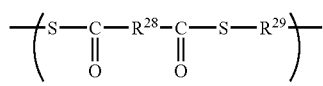 (12)

wherein $R^{28}$ is an alkylene group, aralkylene group or arylene group, and $R^{29}$ is an alkylene group, aralkylene group, arylene group, alkylene-arylene-alkylene group, alkylsilylene group or alkylgermylene group,

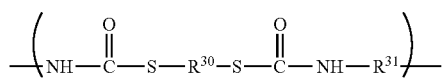 (13)

wherein $R^{30}$ and $R^{31}$ are each independently an alkylene group, aralkylene group, arylene group, alkylene-arylene-alkylene group, alkylsilylene group or alkylgermylene group,,

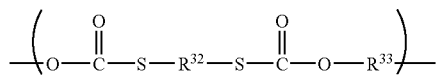 (14)

wherein $R^{32}$ and $R^{33}$ are each independently an alkylene group, aralkylene group, arylene group, alkylene-arylene-alkylene group, alkylsilylene group or alkylgermylene group.

4. The composition of claim 1, wherein the decomposable compound (A) is a compound having the structure of formula (1):

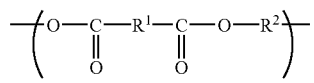 (1)

wherein $R^1$ is an alkylene group, perfluoroalkylene group, alkylsilylene group, alkylene- arylene-alkylene group or arylene group, and $R^2$ is an alkylene group, perfluoroalkylene group, alkylene-arylene-alkylene group, arylene group, alkylsilylene group or alkylgermylene group, where each of the above alkylene groups and perfluoroalkylene groups optionally contains a —O—, —CO—, —COO— or —OCOO— bond.

5. The composition of claim 1, wherein the component (B) contains a binder component together with the inorganic oxide particles.

6. A refractive index changing method, comprising:
exposing the radiation sensitive refractive index changing composition of claim 1 to radiation.

7. A method of forming a refractive index pattern, comprising:
exposing a patterned portion of the radiation sensitive refractive index changing composition of claim 1 to radiation.

8. A method of forming a refractive index pattern, comprising:
exposing a patterned portion of the radiation sensitive refractive index changing composition of claim 1 to radiation; and
treating the exposed composition with (D) a stabilizer.

9. A method of forming a refractive index pattern, comprising:
exposing a patterned portion of the radiation sensitive refractive index changing composition of claim 2 to radiation; and then
treating the exposed composition with (D) a stabilizer at a temperature at which the stabilizer can react with the decomposable compound (A).

10. The method of forming a refractive index pattern of claim 7, wherein the maximum difference in refractive index between an exposed portion and an unexposed portion is 0.02 or more.

11. A refractive index pattern formed by the method of claim 7.

12. An optical material formed by the method of claim 7.

13. The method of forming a refractive index pattern of claim 8 wherein the maximum difference in refractive index between an exposed portion and an unexposed portion is 0.02 or more.

14. The method of forming a refractive index pattern of claim 9 wherein the maximum difference in refractive index between an exposed portion and an unexposed portion is 0.02 or more.

15. A refractive index pattern formed by the method of claim 8.

16. A refractive index pattern formed by the method of claim 9.

17. A refractive index pattern formed by the method of claim 10.

18. An optical material formed by the method of claim 8.

19. An optical material formed by the method of claim 9.

20. An optical material formed by the method of claim 10.

* * * * *